United States Patent
Lee et al.

(10) Patent No.: US 11,895,895 B2
(45) Date of Patent: Feb. 6, 2024

(54) DISPLAY DEVICE AND METHOD OF FABRICATING THE SAME

(71) Applicant: Samsung Display Co., LTD., Yongin-si (KR)

(72) Inventors: So Young Lee, Suwon-si (KR); Sun Hwa Kim, Hwaseong-si (KR); Sung Chul Kim, Seongnam-si (KR); Kwan Hee Lee, Suwon-si (KR); Jong Beom Hong, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 37 days.

(21) Appl. No.: 17/495,795

(22) Filed: Oct. 6, 2021

(65) Prior Publication Data

US 2022/0190045 A1 Jun. 16, 2022

(30) Foreign Application Priority Data

Dec. 16, 2020 (KR) .......................... 10-2020-0176664

(51) Int. Cl.
*G09G 5/00* (2006.01)
*H10K 59/40* (2023.01)
(Continued)

(52) U.S. Cl.
CPC .......... *H10K 59/40* (2023.02); *G06F 3/0412* (2013.01); *H10K 59/122* (2023.02); *H10K 59/38* (2023.02);
(Continued)

(58) Field of Classification Search
CPC ...... H10K 59/40; H10K 59/122; H10K 71/50; H10K 71/00; H10K 59/38; G06F 3/0412; G06F 3/0446; G06F 3/0443
(Continued)

(56) References Cited

U.S. PATENT DOCUMENTS 10,181,503 B2 1/2019 Lee et al.
2017/0003535 A1* 1/2017 Du .................... G02F 1/136204
(Continued)

FOREIGN PATENT DOCUMENTS

CN 111883576 11/2020
EP 3223122 9/2017
(Continued)

*Primary Examiner* — Jennifer T Nguyen
(74) *Attorney, Agent, or Firm* — CANTOR COLBURN LLP

(57) ABSTRACT

A display device includes a substrate, pixel electrodes on the substrate, a bank in which opening areas partially exposing the pixel electrodes are defined, organic light emitting layers disposed on the pixel electrodes, a common electrode disposed on the organic light emitting layers and the bank, an encapsulation layer disposed on the common electrode, a touch electrode which is disposed on the encapsulation layer and does not overlap the opening areas in a thickness direction, a first adhesive member disposed on the touch electrode, a first light blocking layer which is disposed on the first adhesive member and does not overlap the opening areas in the thickness direction, color filters which are disposed on the first adhesive member and overlap the opening areas in the thickness direction, and a support layer which is disposed on the first light blocking layer and the color filters and includes a first organic material.

33 Claims, 24 Drawing Sheets

(51) Int. Cl.
  *G06F 3/041* (2006.01)
  *H10K 59/38* (2023.01)
  *H10K 59/122* (2023.01)
  *H10K 71/00* (2023.01)
  *H10K 71/50* (2023.01)
  *G06F 3/044* (2006.01)

(52) U.S. Cl.
  CPC ............. *H10K 71/00* (2023.02); *H10K 71/50* (2023.02); *G06F 3/0443* (2019.05); *G06F 3/0446* (2019.05)

(58) Field of Classification Search
  USPC ........................................................ 345/173
  See application file for complete search history.

(56) References Cited

U.S. PATENT DOCUMENTS

| | | |
|---|---|---|
| 2017/0278899 A1 | 9/2017 | Yang et al. |
| 2017/0351362 A1* | 12/2017 | Nukui .................. G06F 3/0445 |
| 2019/0088906 A1* | 3/2019 | Park ..................... H10K 50/818 |
| 2019/0146622 A1* | 5/2019 | Kang .................... G06F 3/0412 |
| | | 345/173 |
| 2019/0179466 A1* | 6/2019 | Kim ...................... H10K 59/35 |
| 2019/0214435 A1 | 7/2019 | Yang et al. |
| 2019/0221779 A1 | 7/2019 | Jang et al. |
| 2019/0251318 A1* | 8/2019 | Jung .................. H10K 50/8445 |
| 2019/0341428 A1 | 11/2019 | Lee et al. |
| 2019/0346972 A1 | 11/2019 | Wang |
| 2021/0071041 A1* | 3/2021 | Sahni ........................ C09J 7/381 |
| 2021/0200363 A1* | 7/2021 | Lee ....................... H10K 59/121 |
| 2021/0376003 A1* | 12/2021 | Xu ........................ G06F 3/0412 |
| 2022/0020825 A1 | 1/2022 | Yang et al. |

FOREIGN PATENT DOCUMENTS

| | | |
|---|---|---|
| EP | 3511808 | 7/2019 |
| KR | 101586736 | 1/2016 |
| KR | 1020160127274 | 11/2016 |
| KR | 1020180046708 | 5/2018 |

\* cited by examiner

DISPLAY DEVICE AND METHOD OF FABRICATING THE SAME

This application claims priority to Korean Patent Application No. 10-2020-0176664 filed on Dec. 16, 2020, and all the benefits accruing therefrom under 35 U.S.C. § 119, the content of which in its entirety is herein incorporated by reference.

BACKGROUND

1. Field

Embodiments of the invention relate to a display device and a method of fabricating the same.

2. Description of the Related Art

As an information society develops, a demand for display devices for displaying images is increasing in various forms. Display devices are being applied to various electronic devices such as smartphones, digital cameras, notebook computers, navigation devices, and smart televisions, for example.

The display devices may be flat panel display devices such as liquid crystal display devices, field emission display devices, and light emitting display devices. The light emitting display devices include organic light emitting display devices including organic light emitting elements, inorganic light emitting display devices including inorganic light emitting elements such as inorganic semiconductors, and micro or nano light emitting display devices including micro or nano light emitting elements.

The display devices generally include an anti-reflection member such as a polarizing plate attached onto a display panel to reduce reflection of external light by metal lines of the display panel. Recently, a color filter layer including color filters and a black matrix is being used as an anti-reflection member instead of the polarizing plate to reduce the fabrication cost of a display device.

SUMMARY

When a color filter layer is directly formed on a display panel including organic light emitting elements in order to use the color filter layer as an anti-reflection member a new facility for forming the color filter layer is desired. In addition, since the color filter layer is formed after the organic light emitting elements are formed, there is a limitation in that the color filter layer must be formed by a low-temperature process. That is, when the color filter layer is directly formed on the display panel, the fabrication cost may increase due to investment in new facilities and materials used in a low-temperature process.

Embodiments of the invention provide a display device which may prevent or minimize an increase in fabrication cost by attaching a color filter layer instead of a polarizing plate onto a display panel.

Embodiments of the invention provide a method of fabricating a display device which may prevent or minimize an increase in fabrication cost by attaching a color filter layer instead of a polarizing plate onto a display panel.

An embodiment of the invention provides a display device which includes a substrate, a plurality of pixel electrodes which are disposed on the substrate, a bank in which opening areas partially exposing the plurality of pixel electrodes, respectively, are defined, organic light emitting layers which are disposed on the plurality of pixel electrodes to correspond to the plurality of pixel electrodes, respectively, a common electrode which is disposed on the organic light emitting layers and the bank, an encapsulation layer which is disposed on the common electrode, a touch electrode which is disposed on the encapsulation layer and does not overlap the opening areas in a thickness direction of the substrate which is perpendicular to a main plane extension direction of the substrate, a first adhesive member which is disposed on the touch electrode, a first light blocking layer which is disposed on the first adhesive member and does not overlap the opening areas in the thickness direction of the substrate, a plurality of color filters which are disposed on the first adhesive member and overlap the opening areas in the thickness direction of the substrate, and a support layer which is disposed on the first light blocking layer and the plurality of color filters and includes a first organic material.

In an embodiment, the display device may further include a cover window which is disposed on the support layer, and a second adhesive member which is disposed between the support layer and the cover window.

In an embodiment, the display device may further include a separation layer which is disposed on the support layer and includes a second organic material different from the first organic material.

In an embodiment, a thickness of the separation layer may be smaller than a thickness of the support layer.

In an embodiment, the adhesion between the support layer and the plurality of color filters may be greater than the adhesion between the support layer and the separation layer.

In an embodiment, a width of the touch electrode may be smaller than a width of the first light blocking layer.

In an embodiment, the display device may further include a second light blocking layer which is disposed between the touch electrode and the first adhesive member and does not overlap the opening areas in the thickness direction of the substrate.

In an embodiment, optical density of the second light blocking layer may be higher than optical density of the first light blocking layer.

In an embodiment, a thickness of the second light blocking layer may be greater than a thickness of the first light blocking layer.

In an embodiment, a weight ratio of a black pigment of the second light blocking layer may be greater than a weight ratio of a black pigment of the first light blocking layer.

In an embodiment, a minimum width of the second light blocking layer may be greater than a width of the touch electrode, and the minimum width of the second light blocking layer may be greater than a minimum width of the first light blocking layer.

In an embodiment, the minimum width of the first light blocking layer may be greater than the width of the touch electrode.

In an embodiment, the width of the touch electrode may be greater than the minimum width of the first light blocking layer.

In an embodiment, the display device may further include a first emission area which is disposed on a first pixel electrode among the plurality of pixel electrodes and includes a first organic light emitting layer which emits first light among the organic light emitting layers, a second emission area which is disposed on a second pixel electrode among the plurality of pixel electrodes and includes a second organic light emitting layer which emits second light among the organic light emitting layers, a third emission area which is disposed on a third pixel electrode among the plurality of pixel electrodes and includes a third organic light emitting layer which emits third light among the organic light emitting layers, and a fourth emission area which is disposed on a fourth pixel electrode among the plurality of pixel electrodes and includes the second organic light emitting layer.

In an embodiment, the minimum width of the first light blocking layer disposed between the first emission area and the second emission area may be different from the minimum width of the first light blocking layer disposed between the second emission area and the third emission area.

In an embodiment, a minimum width of the first light blocking layer disposed between the third emission area and the fourth emission area may be different from a minimum width of the first light blocking layer disposed between the first emission area and the fourth emission area.

In an embodiment, a minimum width of the first light blocking layer disposed between the first emission area and the second emission area may be equal to a minimum width of the first light blocking layer disposed between the first emission area and the fourth emission area.

In an embodiment, a minimum width of the first light blocking layer disposed between the second emission area and the third emission area may be equal to a minimum width of the first light blocking layer disposed between the third emission area and the fourth emission area.

In an embodiment, a minimum width of the second light blocking layer disposed between the first emission area and the second emission area may be different from a minimum width of the second light blocking layer disposed between the second emission area and the third emission area.

In an embodiment, a minimum width of the second light blocking layer disposed between the third emission area and the fourth emission area may be different from a minimum width of the second light blocking layer disposed between the first emission area and the fourth emission area.

In an embodiment, a minimum width of the second light blocking layer disposed between the first emission area and the second emission area may be equal to a minimum width of the second light blocking layer disposed between the first emission area and the fourth emission area.

In an embodiment, a minimum width of the second light blocking layer disposed between the second emission area and the third emission area may be equal to a minimum width of the second light blocking layer disposed between the third emission area and the fourth emission area.

In an embodiment, a distance from the first emission area to the first light blocking layer may be smaller than a distance from the first emission area to the second light blocking layer in the main plane extension direction of the substrate.

In an embodiment, the plurality of color filters may include a first color filter which overlaps the first emission area in the thickness direction of the substrate, a second color filter which overlaps the second emission area in the thickness direction of the substrate, and a third color filter which overlaps the third emission area in the thickness direction of the substrate.

In an embodiment, the display device may further include a second light blocking layer which is disposed between the touch electrode and the encapsulation layer and does not overlap the opening areas in the thickness direction of the substrate.

In an embodiment, the display device may further include an ultraviolet absorbing layer which is disposed on the touch electrode and absorbs light having a wavelength of about 200 nanometers (nm) to about 400 nm.

In an embodiment, the display device may further include a light absorbing layer which is disposed on the touch electrode and absorbs light having a predetermined wavelength range.

An embodiment of the invention provides a display device which includes a substrate, a plurality of pixel electrodes which are disposed on the substrate, a bank which includes opening areas partially exposing the plurality of pixel electrodes, respectively, organic light emitting layers which are disposed on the plurality of pixel electrodes to correspond to the plurality of pixel electrodes, respectively, a common electrode which is disposed on the organic light emitting layers and the bank, an encapsulation layer which is disposed on the common electrode, a first adhesive member which is disposed on the encapsulation layer, a first light blocking layer which is disposed on the first adhesive member and does not overlap the opening areas in a thickness direction of the substrate which is perpendicular to a main plane extension direction of the substrate, a plurality of color filters which are disposed on the first adhesive member and overlap the opening areas in the thickness direction of the substrate, a support layer which is disposed on the first light blocking layer and the plurality of color filters and includes a first organic material, and a touch sensing layer which is disposed on the support layer and includes a touch electrode.

In an embodiment, the display device may further include a second adhesive member which is disposed between the support layer and the touch sensing layer, a cover window which is disposed on the touch sensing layer, and a third adhesive member which is disposed between the touch sensing layer and the cover window.

In an embodiment, at least any one of the first adhesive member and the second adhesive member may include a low dielectric constant material.

In an embodiment, the low dielectric constant material may include hollow particles having a shell and a hollow surrounded by the shell.

In an embodiment, the shell may include at least one of silica ($SiO_2$), magnesium fluoride ($MgF_2$), and iron oxide ($Fe_3O_4$).

In an embodiment, a dielectric constant of at least any one of the first adhesive member and the second adhesive member may be 3.0 or less.

An embodiment of the invention provides a method of fabricating a display device, the method includes forming a plurality of display panels on a surface of a first support substrate, forming a separation layer on a surface of a second support substrate and forming a support layer on the separation layer, and forming a plurality of color filter layers on the support layer, attaching the plurality of display panels of the first support substrate to the color filter layers of the second support substrate by a plurality of first adhesive members, cutting the support layer of the second support substrate, separating the separation layer of the second support substrate from the support layer, and cutting the plurality of display panels and attaching a cover window onto the support layer of each of the color filter layers by a plurality of second adhesive members.

In an embodiment, the adhesion between the support layer and the color filter layers may be greater than the adhesion between the support layer and the separation layer.

In an embodiment, in the cutting the support layer of the second support substrate, the support layer may be cut to separate first areas of the support layer which overlap the color filter layers in a thickness direction of the second support substrate which is perpendicular to a main plane extension direction of the second support substrate from second areas of the support layer which do not overlap the color filter layers.

In an embodiment, in the separating the separation layer of the second support substrate from the support layer, a part of the separation layer may remain on a surface of the support layer.

In an embodiment, a thickness of the part of the separation layer may be smaller than a thickness of the support layer.

BRIEF DESCRIPTION OF THE DRAWINGS

These and/or other features of the invention will become apparent and more readily appreciated from the following description of the embodiments, taken in conjunction with the accompanying drawings, in which.

DETAILED DESCRIPTION

Figure 1:
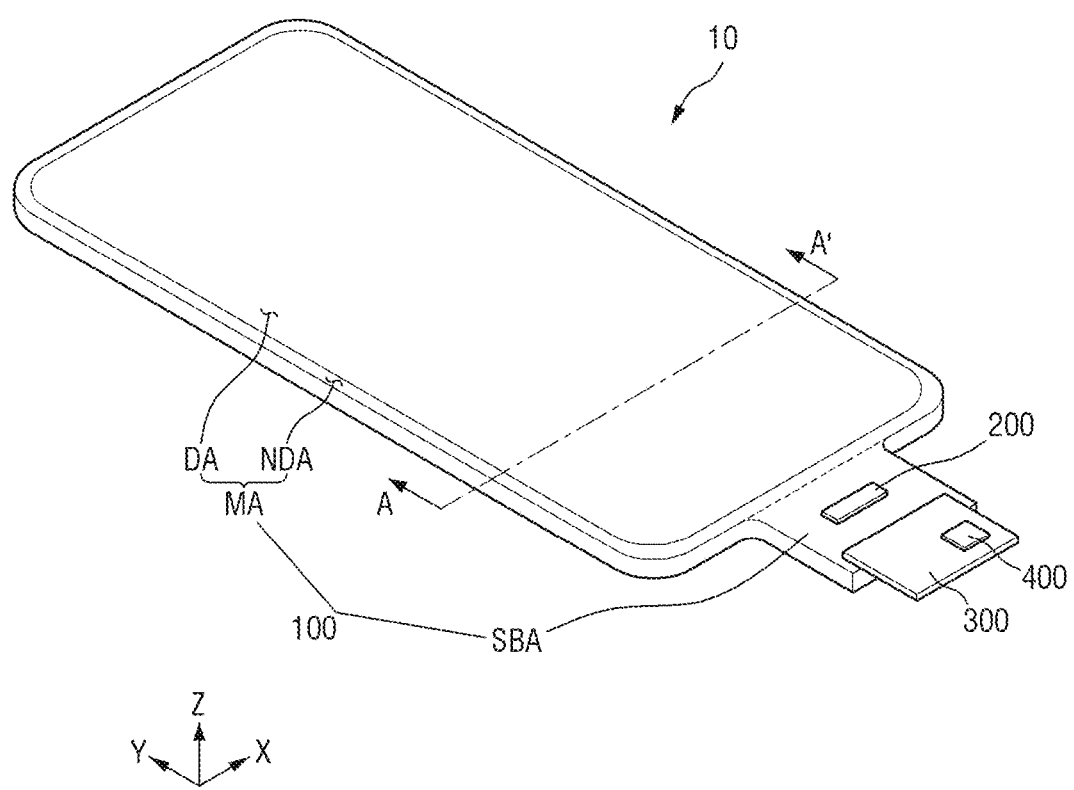
FIG. 1 is a perspective view of an embodiment of a display device.

Embodiments of the invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached drawing figures, the thickness of layers and regions is exaggerated for clarity.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

It will also be understood that when a layer is referred to as being "on" another layer or substrate, it can be directly on the other layer or substrate, or intervening layers may also be present. In contrast, when an element is referred to as being "directly on" another element, there are no intervening elements present.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." "At least one of A and B" means "A and/or B." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. A region illustrated or described as flat may, typically, have rough and/or nonlinear features, for example. Moreover, sharp angles that are illustrated may be rounded. Thus, the regions illustrated in the drawing figures are schematic in nature and their shapes are not intended to illustrate the precise shape of a region and are not intended to limit the scope of the claims.

Hereinafter, embodiments of the invention will be described in detail with reference to the accompanying drawings.

FIG. 1 is a perspective view of an embodiment of a display device 10.

Referring to FIG. 1, the display device 10 in the embodiment may be applied to portable electronic devices such as mobile phones, smartphones, tablet personal computers ("PCs"), mobile communication terminals, electronic notebooks, electronic books, portable multimedia players ("PMPs"), navigation devices, and ultra-mobile PCs ("UMPCs"). In an alternative embodiment, the display device 10 may be applied as a display unit of a television, a notebook computer, a monitor, a billboard, or the Internet of things ("IoT"). In an alternative embodiment, the display device 10 may be applied to wearable devices such as smart watches, watch phones, glass-like displays, and head-mounted displays ("HMDs"). In an alternative embodiment, the display device 10 may be applied to a dashboard of a vehicle, a center fascia of a vehicle, a center information display ("CID") disposed on a dashboard of a vehicle, a room mirror display in place of a side mirror of a vehicle, or a display disposed on the back of a front seat as an entertainment for rear-seat passengers of a vehicle.

The display device 10 in the embodiment may be a light emitting display device such as an organic light emitting display device using organic light emitting elements, a quantum dot light emitting display device including quantum dot light emitting layers, an inorganic light emitting display device including inorganic semiconductors, or a micro or nano light emitting display device using micro or nano light emitting diodes. A case where the display device 10 in the embodiment is an organic light emitting display device using organic light emitting elements will be mainly described below; but the invention is not limited thereto.

The display device 10 includes a display panel 100, a display driving circuit 200, a circuit board 300, and a touch driving circuit 400.

The display panel 100 may be shaped like a quadrangular (e.g., rectangular) plane having short sides in a first direction (X-axis direction) and long sides in a second direction (Y-axis direction) intersecting the first direction (X-axis direction). Each corner where a short side extending in the first direction (X-axis direction) meets a long side extending in the second direction (Y-axis direction) may be rounded with a predetermined curvature or may be right-angled. The planar shape of the display panel 100 is not limited to the quadrangular shape but may also be another polygonal shape, a circular shape, or an oval shape. The display panel 100 may be formed or provided flat, but the invention is not limited thereto. In an embodiment, the display panel 100 includes curved parts formed or provided at left and right ends and having a constant or varying curvature, for example. In addition, the display panel 100 may be flexible so that it may be curved, bent, folded or rolled.

The display panel 100 includes a main area MA and a sub area SBA.

The main area MA includes a display area DA displaying an image and a non-display area NDA disposed around the display area DA. The display area DA includes pixels PX (refer to FIG. 5) that display an image. The sub area SBA may protrude from a side of the main area MA in the second direction (Y-axis direction).

Figure 2:
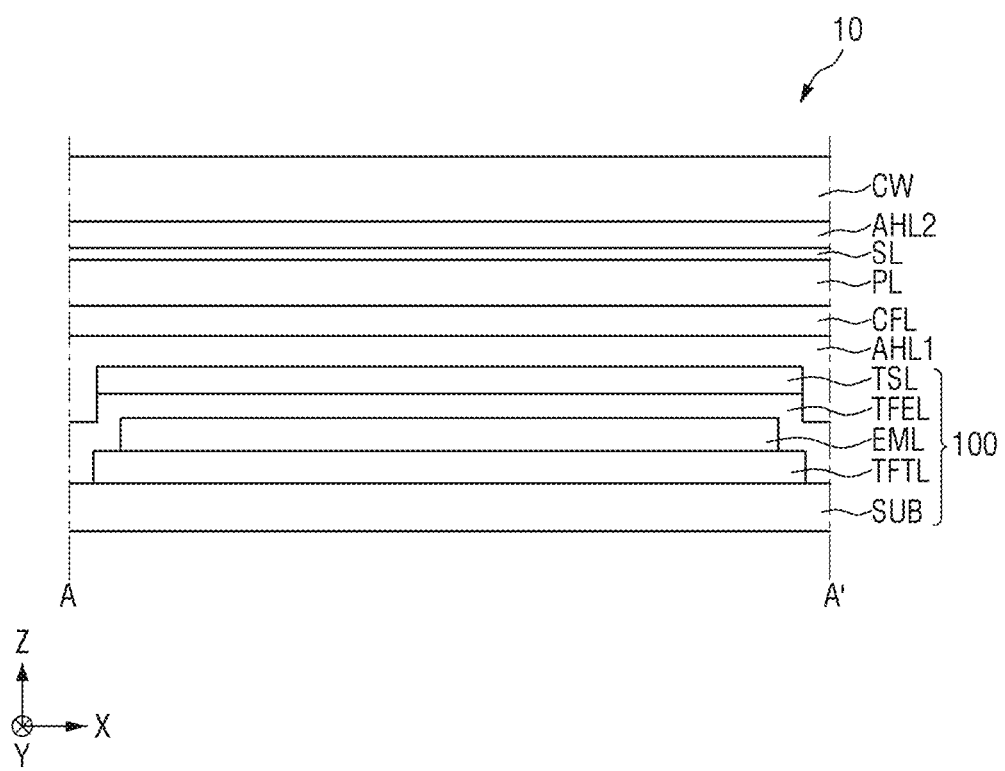
FIG. 2 is a cross-sectional view of an embodiment of the display device.

Although the sub area SBA is unfolded in FIGS. 1 and 2, it may also be bent, in which case the sub area SBA may be disposed on a lower surface of the display panel 100. When the sub area SBA is bent, it may be overlapped by the main area MA in a thickness direction (Z-axis direction) of a substrate SUB which is perpendicular to a main plane extension direction of the substrate SUB defined by the X-axis direction and the Y-axis direction. The display driving circuit 200 may be disposed in the sub area SBA.

The display driving circuit 200 may generate signals and voltages for driving the display panel 100. In an embodiment, the display driving circuit 200 may be formed or provided as an integrated circuit ("IC") and attached onto the display panel 100 using a chip-on-glass ("COG") method, a chip-on-plastic ("COP") method, or an ultrasonic bonding method. However, the invention is not limited thereto. In an embodiment, the display driving circuit 200 may also be attached onto the circuit board 300 using a chip-on-film ("COF") method, for example.

The circuit board 300 may be attached to an end of the sub area SBA of the display panel 100. Therefore, the circuit board 300 may be electrically connected to the display panel 100 and the display driving circuit 200. The display panel 100 and the display driving circuit 200 may receive various voltages such as digital video data, timing signals, and driving voltages through the circuit board 300. The circuit board 300 may be a flexible printed circuit board, a printed circuit board, or a flexible film such as a COF.

The touch driving circuit 400 may be disposed on the circuit board 300. The touch driving circuit 400 may be formed or provided as an IC and attached to the circuit board 300.

The touch driving circuit 400 may be electrically connected to touch electrodes of the display panel 100. The touch electrodes may include driving electrodes TE (refer to FIG. 3) and sensing electrodes RE (refer to FIG. 3). The touch driving circuit 400 may transmit driving signals to the driving electrodes TE (refer to FIG. 3) and measure charge changes in mutual capacitance from the sensing electrodes RE (refer to FIG. 3). Each of the driving signals may be a signal having a plurality of driving pulses. The touch driving circuit 400 may determine whether a user's touch or proximity has occurred according to the charge changes in the mutual capacitance. The user's touch indicates that an object such as a user's finger or a pen directly contacts a surface of the display device 10. The user's proximity indicates that an object such as a user's finger or a pen is positioned (e.g., hovers) above the surface of the display device 10

FIG. 2 is a cross-sectional view of the display device 10. FIG. 2 is a cross-sectional view of an embodiment of a display device 10 taken along line A-A' of FIG. 1.

Referring to FIG. 2, the display device 10 includes the display panel 100, a first adhesive member AHL1, a color filter layer CFL, a support layer PL, a separation layer SL, a second adhesive member AHL2, and a cover window CW.

The display panel 100 includes the substrate SUB, a thin-film transistor ("TFT") layer TFTL, a light emitting element layer EML, an encapsulation layer TFEL, and a touch sensing layer TSL.

The TFT layer TFTL may be disposed on the substrate SUB. The TFT layer TFTL may include a plurality of transistors TR (refer to FIG. 4).

The light emitting element layer EML may be disposed on the TFT layer TFTL. The light emitting element layer EML includes a plurality of light emitting elements LEL (refer to FIG. 4) disposed in a plurality of emission areas EA1 through EA4 (refer to FIG. 3), respectively.

The encapsulation layer TFEL may be disposed on the light emitting element layer EML. The encapsulation layer TFEL may include a plurality of inorganic layers to encapsulate the light emitting element layer EML. The encapsulation layer TFEL may include one organic layer to protect the light emitting element layer EML from particles.

The touch sensing layer TSL may be disposed on the encapsulation layer TFEL. The touch sensing layer TSL may include a plurality of touch electrodes to detect a touch of a person or an object.

The first adhesive member AHL1 may be disposed on the touch sensing layer TSL of the display panel 100. The first adhesive member AHL1 bonds the touch sensing layer TSL of the display panel 100 to the color filter layer CFL. In an embodiment, the first adhesive member AHL1 may be a transparent adhesive member such as an optically clear adhesive ("OCA") film or an optically clear resin ("OCR").

The color filter layer CFL may be disposed on the first adhesive member AHL1. The color filter layer CFL may be disposed in the display area DA and the non-display area NDA of the main area MA. The color filter layer CFL may be an anti-reflection member for reducing reflection of external light from metal lines and metal electrodes of the display panel 100. The color filter layer CFL includes a plurality of color filters CF1 through CF3 (refer to FIG. 4) and a first light blocking layer BM1 (refer to FIG. 4). In an embodiment, the color filter layer CFL may include a first color filter CF1 (refer to FIG. 4) that transmits light in a first wavelength range, a second color filter CF2 (refer to FIG. 4) that transmits light in a second wavelength range, a third color filter CF3 (refer to FIG. 4) that transmits light in a third wavelength range, and the first light blocking layer BM1 (refer to FIG. 4) that absorbs light, for example.

The support layer PL may be disposed on the color filter layer CFL. The support layer PL supports the color filter layer CFL. The support layer PL may include a first organic material.

The separation layer SL may be disposed on the support layer PL. The separation layer SL may be a layer that is separated from the support layer PL during a process of fabricating the display device. A thickness of the separation layer SL may be smaller than a thickness of the support layer PL. The separation layer SL may include a second organic material different from the first organic material.

The second adhesive member AHL2 may be disposed on the separation layer SL or the support layer PL. The second adhesive member AHL2 bonds the separation layer SL or the support layer PL to the cover window CW. In an embodiment, the second adhesive member AHL2 may be a transparent adhesive member such as an OCA film or an OCR.

The cover window CW may be disposed on the second adhesive member AHL2. The cover window CW protects an upper surface of the display device 10. In an embodiment, the cover window CW may be an inorganic material such as glass or an organic material such as plastic or a polymer material.

As illustrated in FIG. 2, in order to reduce reflection of external light by the metal lines of the display panel 100, not a polarizing plate but the color filter layer CFL including the color filters and the first light blocking layer may be attached onto the display panel 100. In this case, no new facility is desired to directly form the color filter layer CFL on the display panel 100, and a material with a lower unit cost than a material used in a low-temperature process may be used. Therefore, an increase in fabrication cost may be prevented or minimized.

Figure 3:
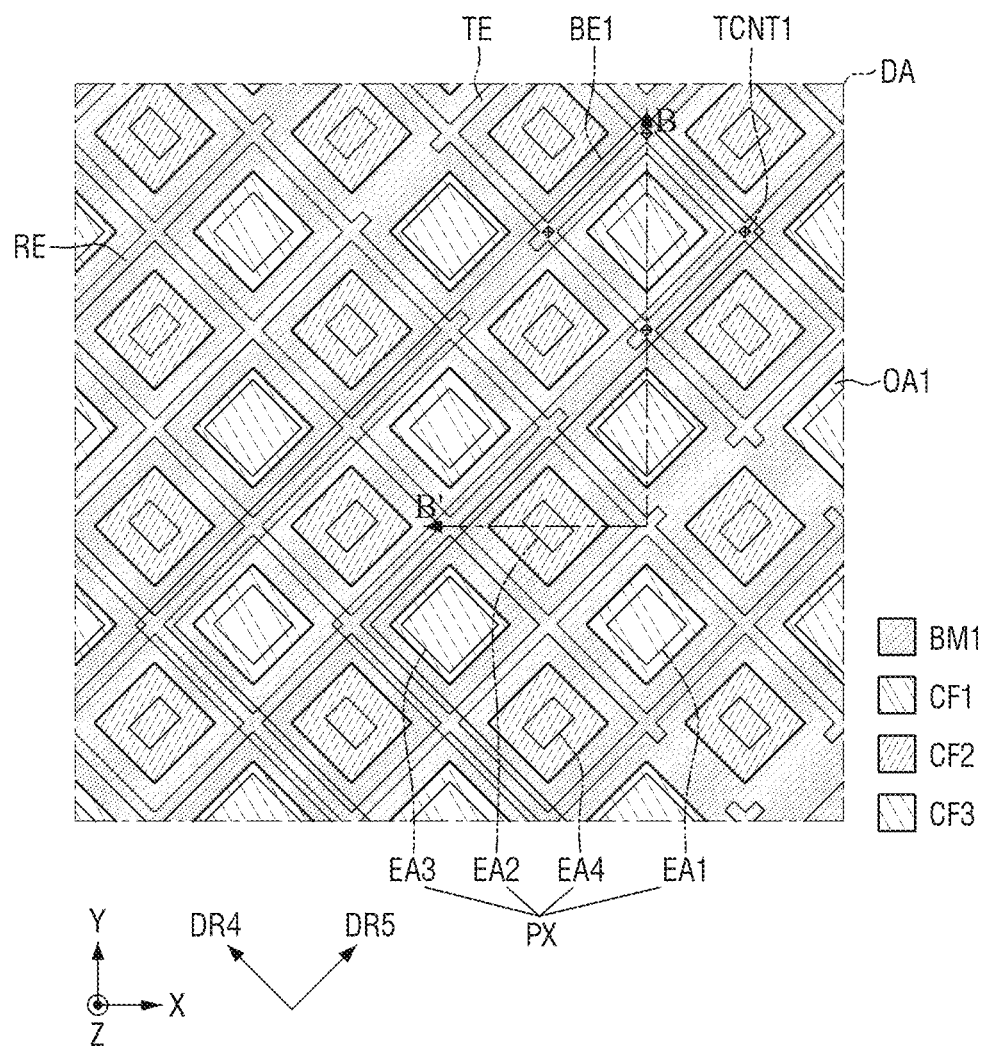
FIG. 3 is a plan view of an embodiment of a display area of the display device.

FIG. 3 is a plan view of an embodiment of the display area DA of the display device 10.

For ease of description, FIG. 3 illustrates the driving electrodes TE, the sensing electrodes RE, a connection electrode BE1, first emission areas EA1, second emission areas EA2, third emission areas EA3 and fourth emission areas EA4 and may not illustrate the other elements.

Referring to FIG. 3, the display area DA of the display device 10 includes the pixels PX. Each of the pixels PX includes the first emission area EA1 which emits first light, the second emission area EA2 and the fourth emission area EA4 which emit second light, and the third emission area EA3 which emits third light. In an embodiment, a first color may be red, a second color may be green, and a third color may be blue, for example. However, the invention is not limited thereto, and in another embodiment, the first to third colors may be other colors.

The first emission area EA1 and the second emission area EA2 of each of the pixels PX may neighbor each other in a fourth direction DR4, and the third emission area EA3 and the fourth emission area EA4 may neighbor each other in the fourth direction DR4. The first emission area EA1 and the fourth emission area EA4 of each of the pixels PX may neighbor each other in a fifth direction DR5, and the second emission area EA2 and the third emission area EA3 may neighbor each other in the fifth direction DR5. The fourth direction DR4 may be a direction inclined at an angle of about 45 degrees with reference to the first direction (X-axis direction), and the fifth direction DR5 may be a direction orthogonal to the fourth direction DR4.

Each of the first emission area EA1, the second emission area EA2, the third emission area EA3, and the fourth emission area EA4 may have a rhombic or quadrangular (e.g., rectangular) planar shape. However, the invention is not limited thereto, and each of the first emission area EA1, the second emission area EA2, the third emission area EA3 and the fourth emission area EA4 may also have a polygonal, circular or elliptical planar shape other than the quadrangular planar shape. In addition, the area of the third emission area EA3 is the largest, and the area of each of the second emission area EA2 and the fourth emission area EA4 is the smallest in FIG. 3, but the invention is not limited thereto.

The second emission areas EA2 and the fourth emission areas EA4 may be disposed in odd rows. The second emission areas EA2 and the fourth emission areas EA4 may be disposed side by side in the first direction (X-axis direction) in each of the odd rows. The second emission areas EA2 and the fourth emission areas EA4 may be alternately arranged in each of the odd rows. Each of the second emission areas EA2 may have long sides in the fourth direction DR4 and short sides in the fifth direction DR5, whereas each of the fourth emission areas EA4 has short sides in the fourth direction DR4 and long sides in the fifth direction DR5. The fourth direction DR4 is a direction between the first direction (X-axis direction) and the second direction (Y-axis direction) and may be a direction inclined at an angle of about 45 degrees with reference to the first direction (X-axis direction). The fifth direction DR5 may be a direction orthogonal to the fourth direction DR4.

The first emission areas EA1 and the third emission areas EA3 may be disposed in even rows. The first emission areas EA1 and the third emission areas EA3 may be disposed side by side in the first direction (X-axis direction) in each of the even rows. The first emission areas EA1 and the third emission areas EA3 may be alternately arranged in each of the even rows.

The second emission areas EA2 and the fourth emission areas EA4 may be disposed in odd columns. The second emission areas EA2 and the fourth emission areas EA4 may be disposed side by side in the second direction (Y-axis direction) in each of the odd columns. The second emission areas EA2 and the fourth emission areas EA4 may be alternately disposed in each of the odd columns.

The first emission areas EA1 and the third emission areas EA3 may be disposed in even columns. The first emission areas EA1 and the third emission areas EA3 may be disposed side by side in the second direction (Y-axis direction) in each of the even columns. The first emission areas EA1 and the third emission areas EA3 may be alternately disposed in each of the even columns.

Each of the driving electrodes TE, the sensing electrodes RE, and the connection electrode BE1 may have a mesh structure or a net structure in a plan view. Each of the driving electrodes TE, the sensing electrodes RE, and the connection electrode BE1 may not overlap the first to fourth emission areas EA1 through EA4 in a third direction (Z-axis direction). Accordingly, it is possible to prevent light emitted from the first to fourth emission areas EA1 through EA4 from being blocked by the driving electrodes TE, the sensing electrodes RE, and the connection electrode BE1.

The driving electrodes TE and the sensing electrodes RE may be spaced apart from each other. A gap may be defined between a driving electrode TE and a sensing electrode RE adjacent to each other. The connection electrode BE1 may be bent at least once. In an embodiment, although the connection electrode BE1 is shaped like a bracket ("<" or ">") in a plan view, for example, the planar shape of the connection electrode BE1 is not limited thereto.

The connection electrode BE1 may overlap the driving electrodes TE and a sensing electrode RE in the third direction (Z-axis direction). A side of the connection electrode BE1 may be connected to any one of the driving electrodes TE adjacent in the second direction (Y-axis direction) through touch contact holes TCNT1. The other side of the connection electrode BE1 may be connected to the other one of the driving electrodes TE adjacent in the second direction (Y-axis direction) through touch contact holes TCNT1. Due to the connection electrodes BE1, the driving electrodes TE and the sensing electrodes RE may be electrically separated at their intersections. Therefore, mutual capacitance may be generated between the driving electrodes TE and the sensing electrodes RE.

The first color filters CF1 may overlap the first emission areas EA1 in the third direction (Z-axis direction). The first color filters CF1 may not overlap the second emission areas EA2, the third emission areas EA3, and the fourth emission areas EA4 in the third direction (Z-axis direction). Therefore, the first light emitted from the first emission areas EA1 may exit through the first color filters CF1.

The second color filters CF2 may overlap the second emission areas EA2 and the fourth emission areas EA4 in the third direction (Z-axis direction). The second color filters CF2 may not overlap the first emission areas EA1 and the third emission areas EA3 in the third direction (Z-axis direction). Therefore, the second light emitted from the second emission areas EA2 and the fourth emission areas EA4 may exit through the second color filters CF2.

The third color filters CF3 may overlap the third emission areas EA3 in the third direction (Z-axis direction). The third color filters CF3 may not overlap the first emission areas EA1, the second emission areas EA2, and the fourth emission areas EA4 in the third direction (Z-axis direction). Therefore, the third light emitted from the third emission areas EA3 may exit through the third color filters CF3.

Since the driving electrodes TE, the sensing electrodes RE and the connection electrode BE1 have a mesh structure or a net structure in a plan view, they may surround the first emission areas EA1, the second emission areas EA2, the third emission areas EA3, and the fourth emission areas EA4. However, the driving electrodes TE and the sensing electrodes RE may not surround the first emission areas EA1, the second emission areas EA2, the third emission areas EA3, and the fourth emission areas EA4 at boundaries between the driving electrodes TE and the sensing electrodes RE.

The first light blocking layer BM1 may be disposed between the first emission areas EA1 and the second emission areas EA2, between the second emission areas EA2 and the third emission areas EA3, between the third emission areas EA3 and the fourth emission areas EA4, and between the first emission areas EA1 and the fourth emission areas EA4. The first light blocking layer BM1 may overlap the driving electrodes TE, the sensing electrodes RE, and the connection electrode BE1 in the third direction (Z-axis direction).

First opening areas OA1 may be defined by the first light blocking layer BM1. Each of the first opening areas OA1 may overlap any one of the first emission area EA1, the second emission area EA2, the third emission area EA3, and the fourth emission area EA4. Although the first opening areas OA1 have the same area regardless of the first emission area EA1, the second emission area EA2, the third emission area EA3 and the fourth emission area EA4 in FIG. 3, the invention is not limited thereto. In an embodiment, the first opening areas OA1 may have different areas depending on the first emission area EA1, the second emission area EA2, the third emission area EA3 and the fourth emission area EA4, for example. This will be described later with reference to FIG. 5.

Figure 4:
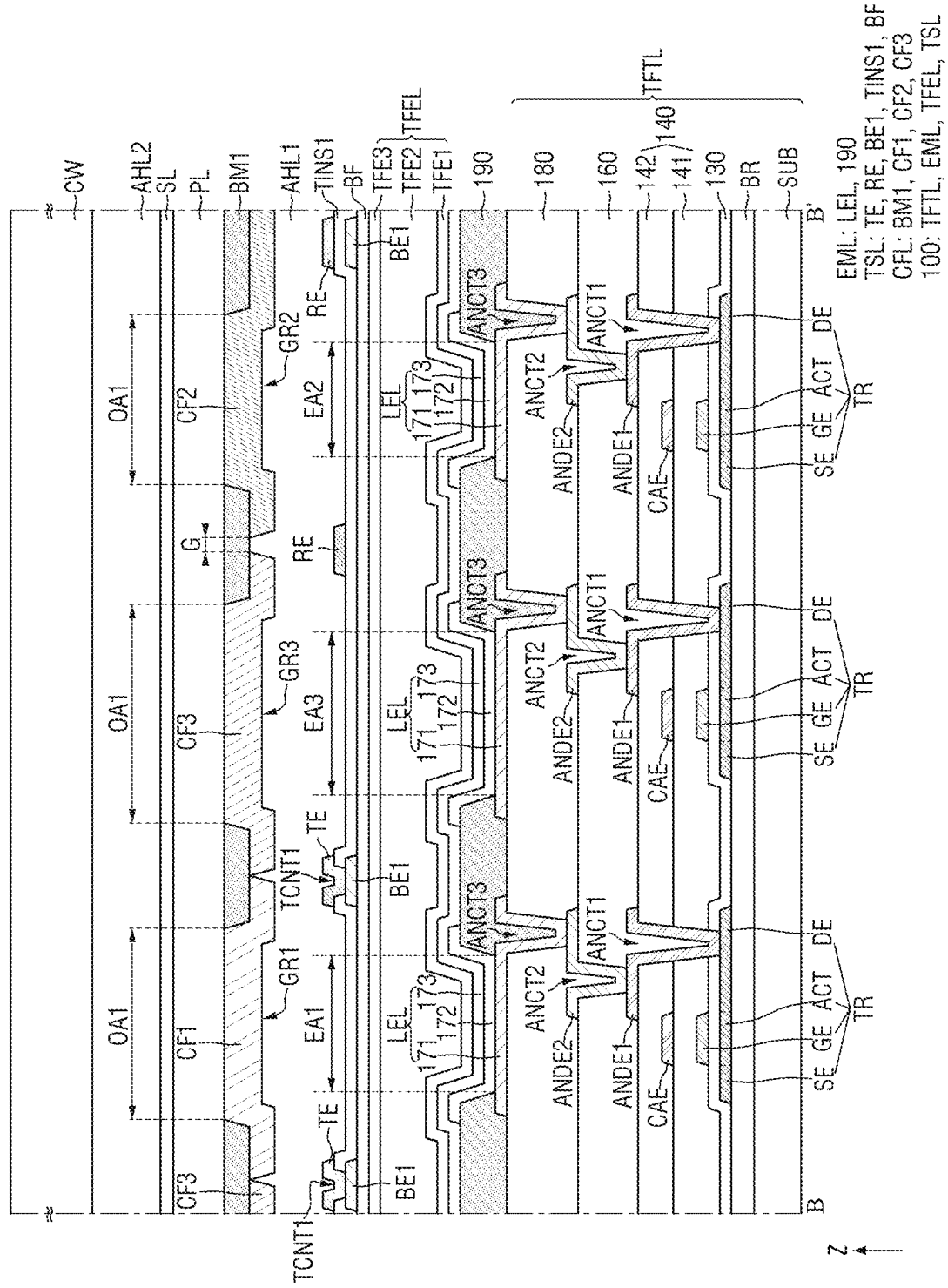
FIG. 4 is a cross-sectional view of an embodiment of the display device taken along line B-B' of FIG. 3.

FIG. 4 is a cross-sectional view of an embodiment of the display device 10 taken along line B-B' of FIG. 3.

Referring to FIG. 4, the substrate SUB may include or consist of an insulating material such as polymer resin. The substrate SUB may be a flexible substrate that may be bent, folded or rolled or may be a rigid substrate.

A barrier layer BR may be disposed on the substrate SUB. The barrier layer BR is a layer for protecting transistors of the TFT layer TFTL and light emitting layers 172 of the light emitting element layer EML from moisture introduced through the substrate SUB which is vulnerable to moisture permeation. The barrier layer BR may include or consist of a plurality of inorganic layers stacked alternately. In an embodiment, the barrier layer BR may be a multilayer in which one or more inorganic layers including or consisting of at least one of a silicon nitride layer, a silicon oxynitride layer, a silicon oxide layer, a titanium oxide layer, and an aluminum oxide layer are alternately stacked, for example.

The transistors TR may be disposed on the barrier layer BR. Each of the transistors TR includes an active layer ACT, a gate electrode GE, a source electrode SE, and a drain electrode DE.

The active layer ACT, the source electrode SE, and the drain electrode DE of each of the transistors TR may be disposed on the barrier layer BR. In an embodiment, the active layer ACT of each of the transistors TR includes polycrystalline silicon, monocrystalline silicon, low-temperature polycrystalline silicon, amorphous silicon, or an oxide semiconductor. The active layer ACT overlapped by the gate electrode GE in the third direction (Z-axis direction) which is the thickness direction of the substrate SUB may be defined as a channel region. The source electrode SE and the drain electrode DE may be regions not overlapped by the gate electrode GE in the third direction (Z-axis direction) and may have conductivity by doping a silicon semiconductor or an oxide semiconductor with ions or impurities.

A gate insulating layer 130 may be disposed on the active layer ACT, the source electrode SE and the drain electrode DE of each of the transistors TR. In an embodiment, the gate insulating layer 130 may include or consist of an inorganic layer such as a silicon nitride layer, a silicon oxynitride layer, a silicon oxide layer, a titanium oxide layer, or an aluminum oxide layer.

The gate electrode GE of each of the transistors TR may be disposed on the gate insulating layer 130. The gate electrode GE may overlap the active layer ACT in the third direction (Z-axis direction). In an embodiment, the gate electrode GE may be a single layer or a multilayer including or consisting of any one or more of molybdenum (Mo), aluminum (Al), chromium (Cr), gold (Au), titanium (Ti), nickel (Ni), neodymium (Nd), copper (Cu), and alloys of the same.

A first inter-insulating film 141 may be disposed on the gate electrode GE of each of the transistors TR. In an embodiment, the first inter-insulating film 141 may include or consist of an inorganic layer such as a silicon nitride layer, a silicon oxynitride layer, a silicon oxide layer, a titanium oxide layer, or an aluminum oxide layer. The first inter-insulating film 141 may include or consist of a plurality of inorganic layers.

Capacitor electrodes CAE may be disposed on the first inter-insulating film 141. A capacitor electrode CAE may overlap the gate electrode GE of each of the transistors TR in the third direction (X-axis direction). Since the first inter-insulating film 141 has a predetermined dielectric constant, the capacitor electrode CAE, the gate electrode GE, and the first inter-insulating film 141 disposed between the capacitor electrode CAE and the gate electrode GE may form a capacitor. In an embodiment, each of the capacitor electrodes CAE may be a single layer or a multilayer including or consisting of any one or more of molybdenum (Mo), aluminum (Al), chromium (Cr), gold (Au), titanium (Ti), nickel (Ni), neodymium (Nd), copper (Cu), and alloys of the same.

A second inter-insulating film 142 may be disposed on the capacitor electrodes CAE. In an embodiment, the second inter-insulating film 142 may include or consist of an inorganic layer such as a silicon nitride layer, a silicon oxynitride layer, a silicon oxide layer, a titanium oxide layer, or an aluminum oxide layer. The second inter-insulating film 142 may include or consist of a plurality of inorganic layers.

First pixel connection electrodes ANDE1 may be disposed on the second inter-insulating film 142. A first pixel connection electrode ANDE1 may be connected to the drain electrode DE of each of the transistors TR through a first connection contact hole ANCT1 penetrating the gate insulating layer 130, the first inter-insulating film 141 and the second inter-insulating film 142. In an embodiment, each of the first pixel connection electrodes ANDE1 may be a single layer or a multilayer including or consisting of any one or more of molybdenum (Mo), aluminum (Al), chromium (Cr), gold (Au), titanium (Ti), nickel (Ni), neodymium (Nd), copper (Cu), and alloys of the same.

A first planarization layer 160 may be disposed on the first pixel connection electrodes ANDE1 to planarize steps due to the transistors TR. In an embodiment, the first planarization layer 160 may include or consist of an organic layer such as acryl resin, epoxy resin, phenolic resin, polyamide resin, or polyimide resin.

Second pixel connection electrodes ANDE2 may be disposed on the first planarization layer 160. Each of the second pixel connection electrodes ANDE2 may be connected to a first pixel connection electrode ANDE1 through a second connection contact hole ANCT2 penetrating the first planarization layer 160. In an embodiment, each of the second pixel connection electrodes ANDE2 may be a single layer or a multilayer including or consisting of any one or more of molybdenum (Mo), aluminum (Al), chromium (Cr), gold (Au), titanium (Ti), nickel (Ni), neodymium (Nd), copper (Cu), and alloys of the same.

A second planarization layer 180 may be disposed on the second pixel connection electrodes ANDE2. In an embodiment, the second planarization layer 180 may include or consist of an organic layer such as acryl resin, epoxy resin, phenolic resin, polyamide resin, or polyimide resin.

The light emitting elements LEL and a bank 190 may be disposed on the second planarization layer 180. Each of the light emitting elements LEL includes a pixel electrode 171, the light emitting layer 172, and a common electrode 173.

The pixel electrode 171 may be disposed on the second planarization layer 180. The pixel electrode 171 may be connected to each of the second pixel connection electrodes ANDE2 through a third connection contact hole ANCT3 penetrating the second planarization layer 180.

In an embodiment of a top emission structure in which light is emitted from the light emitting layer 172 toward the common electrode 173, the pixel electrode 171 may include or consist of a metal material having high reflectivity, such as a stacked structure (Ti/Al/Ti) of aluminum and titanium, a stacked structure (ITO/Al/ITO) of aluminum and indium tin oxide ("ITO"), an APC alloy, or a stacked structure (ITO/APC/ITO) of an APC alloy and ITO. In an embodiment, the APC alloy is an alloy of silver (Ag), palladium (Pd), and copper (Cu).

The bank 190 may be formed or disposed on the second planarization layer 180 to separate the pixel electrodes 171 so as to define a first emission area EA1, a second emission area EA2, a third emission area EA3, and a fourth emission area EA4. The bank 190 may cover edges of the pixel electrodes 171. In an embodiment, the bank 190 may include or consist of an organic layer such as acryl resin, epoxy resin, phenolic resin, polyamide resin, or polyimide resin.

The bank 190 may include a material that absorbs light emitted from the light emitting layer 172 to prevent color mixing. In an embodiment, the bank 190 may include an inorganic black pigment such as carbon black or an organic black pigment, for example. In an embodiment, the color mixing indicates that light of any one of the first to fourth emission areas EA1 through EA4 is mixed with light of another emission area neighboring the emission area and emitted accordingly, for example.

Each of the first emission area EA1, the second emission area EA2, the third emission area EA3, and the fourth emission area EA4 is an area in which the pixel electrode 171 the light emitting layer 172 and the common electrode 173 are sequentially stacked so that holes from the pixel electrode 171 and electrons from the common electrode 173 combine together in the light emitting layer 172 to emit light.

The light emitting layer 172 may be disposed on the pixel electrode 171 and the bank 190. The light emitting layer 172 may include an organic material to emit light of a predetermined color. In this case, the light emitting layer 172 may be also referred to as organic light emitting layers. In an embodiment, the light emitting layer 172 includes a hole transporting layer, an organic material layer, and an electron transporting layer, for example.

The light emitting layer 172 of the first emission area EA1 may include a red organic material that includes a first host material and a first dopant to emit the first light. In this case, the first dopant may be a red fluorescent dopant or a red phosphorescent dopant, and the first light may be red light.

The light emitting layer 172 of the second emission area EA2 may include an organic material that includes a second host material and a second dopant to emit the second light. In this case, the second dopant may be a green fluorescent dopant or a green phosphorescent dopant, and the second light may be green light.

The light emitting layer 172 of the third emission area EA3 may include an organic material that includes a third host material and a third dopant to emit the third light. In this case, the third dopant may be a blue fluorescent dopant or a blue phosphorescent dopant, and the third light may be blue light.

The light emitting layer 172 of the fourth emission area EA4 may include an organic material that emits the second light. The light emitting layer 172 of the fourth emission area EA4 may include an organic material that includes the second host material and the second dopant to emit the second light.

The common electrode 173 may be disposed on the light emitting layer 172. The common electrode 173 may cover the light emitting layer 172. The common electrode 173 may be a common layer common to all of the first emission area EA1, the second emission area EA2, the third emission area EA3, and the fourth emission area EA4. A capping layer may be formed or disposed on the common electrode 173.

In the top emission structure, the common electrode 173 may include or consist of a transparent conductive oxide ("TCO") capable of transmitting light, such as ITO or indium zinc oxide ("IZO"), or a semi-transmissive conductive material such as magnesium (Mg), silver (Ag) or an alloy of Mg and Ag. When the common electrode 173 includes or consists of a semi-transmissive conductive material, light output efficiency may be increased by a microcavity.

The encapsulation layer TFEL may be disposed on the common electrodes 173. The encapsulation layer TFEL includes at least one inorganic layer to prevent oxygen or moisture from permeating into the light emitting element layer EML. In addition, the encapsulation layer TFEL includes at least one organic layer to protect the light emitting element layer EML from foreign substances such as dust. In an embodiment, the encapsulation layer TFEL includes a first encapsulating inorganic layer TFE1, an encapsulating organic layer TFE2, and a second encapsulating inorganic layer TFE3, for example.

The first encapsulating inorganic layer TFE1 may be disposed on the common electrodes 173, the encapsulating organic layer TFE2 may be disposed on the first encapsulating inorganic layer TFE1, and the second encapsulating inorganic layer TFE3 may be disposed on the encapsulating organic layer TFE2. In an embodiment, each of the first encapsulating inorganic layer TFE1 and the second encapsulating inorganic layer TFE3 may be a multilayer in which one or more inorganic layers including or consisting of at least one of a silicon nitride layer, a silicon oxynitride layer, a silicon oxide layer, a titanium oxide layer, and an aluminum oxide layer are alternately stacked. In an embodiment, the encapsulating organic layer TFE2 may include or consist of an organic layer such as acryl resin, epoxy resin, phenolic resin, polyamide resin, or polyimide resin.

The touch sensing layer TSL may be disposed on the encapsulation layer TFEL. The touch sensing layer TSL includes a buffer layer BF, the connection electrode BE1, a touch insulating layer TINS1, a driving electrode TE, a sensing electrode RE.

In an embodiment, the buffer layer BF may include or consist of an inorganic layer such as a silicon nitride layer, a silicon oxynitride layer, a silicon oxide layer, a titanium oxide layer, or an aluminum oxide layer.

The connection electrode BE1 may be disposed on the buffer layer BF. In an embodiment, the connection electrode BE1 may be a single layer or a multilayer including or consisting of any one or more of molybdenum (Mo), aluminum (Al), chromium (Cr), gold (Au), titanium (Ti), nickel (Ni), neodymium (Nd), copper (Cu), and alloys of the same.

The touch insulating layer TINS1 is disposed on the connection electrode BE1. In an embodiment, the touch insulating layer TINS1 may include or consist of an inorganic layer such as a silicon nitride layer, a silicon oxynitride layer, a silicon oxide layer, a titanium oxide layer, or an aluminum oxide layer. In an alternative embodiment, the touch insulating layer TINS1 may include or consist of an organic layer such as acryl resin, epoxy resin, phenolic resin, polyamide resin, or polyimide resin.

The driving electrode TE and the sensing electrode RE may be disposed on the touch insulating layer TINS1. The driving electrode TE and the sensing electrode RE may overlap the connection electrode BE1 in the third direction (Z-axis direction). The driving electrode TE may be connected to the connection electrode BE1 through the touch contact holes TCNT1 penetrating the touch insulating layer TINS1.

The first adhesive member AHL1 may be disposed on the touch sensing layer TSL. The first adhesive member AHL1 bonds the touch sensing layer TSL of the display panel 100 to the color filter layer CFL. In an embodiment, the first adhesive member AHL1 may be a transparent adhesive member such as an OCA film or an OCR.

The color filter layer CFL may be disposed on the first adhesive member AHL1. The color filter layer CFL may include a first color filter CF1, a second color filter CF2, and a third color filter CF3.

The first color filter CF1 may transmit light in the first wavelength range and overlap the first emission area EA1 in the third direction (Z-axis direction). The first emission area EA1 may emit the first light corresponding to light in the first wavelength range. That is, the wavelength range of the first light may overlap the first wavelength range. In an embodiment, the wavelength range of the first light may be wider than the first wavelength range, for example. In an embodiment, the first wavelength range may be about 600 nanometers (nm) to about 750 nm.

The second color filter CF2 may transmit light in the second wavelength range and overlap the second emission area EA2 in the third direction (Z-axis direction). The second emission area EA2 may emit the second light corresponding to light in the second wavelength range. That is, the wavelength range of the second light may overlap the second wavelength range. In an embodiment, the wavelength range of the second light may be wider than the second wavelength range, for example. In an embodiment, the second wavelength range may be about nm 480 to about 560 nm.

The third color filter CF3 may transmit light in the third wavelength range and overlap the third emission area EA3 in the third direction (Z-axis direction). The third emission area EA3 may emit the third light corresponding to light in the third wavelength range. That is, the wavelength range of the third light may overlap the third wavelength range. In an embodiment, the wavelength range of the third light may be wider than the third wavelength range, for example, in an embodiment, the third wavelength range may be about 370 nm to about 460 nm.

The first light blocking layer BM1 may include a light absorbing material to lower the transmittance of light. In an embodiment, the first light blocking layer BM1 may include an inorganic black pigment such as carbon black or an organic black pigment. The first light blocking layer BM1 may include the same material as that of the bank 190, for example.

The first light blocking layer BM1 may overlap the driving electrode TE and the sensing electrode RE in the third direction (Z-axis direction). The first light blocking layer BM1 may overlap the connection electrode BE1 in the third direction (Z-axis direction). The first light blocking layer BM1 may overlap the touch contact holes TCNT1 in the third direction (Z-axis direction).

The first opening areas OA1 may be defined by the first light blocking layer BM1. The first opening areas OA1 may be areas in which the first light blocking layer BM1 is not disposed. The first opening areas OAT may overlap the first emission area FM, the second emission area EA2, the third emission area EA3, and the fourth emission area EA4.

Since the first color filter CF1, the second color filter CF2, and the third color filter CF3 are formed or disposed on the support layer PL, an upper surface of the first color filter CF1, an upper surface of the second color filter CF2, and an upper surface of the third color filter CF3 may be flat.

In contrast, since edges of the first color filter CF1 overlap the first light blocking layer BM1, the edges of the first color filter CF1 may be thicker than the center of the first color filter CF1. Therefore, a first groove GR1 which is concave may be defined in a lower surface of the first color filter CF1 as illustrated in FIG. 4. The first groove GR1 of the first color filter CF1 may overlap the first emission area EA1.

In addition, a second groove GR2 which is concave may be defined in a lower surface of the second filter CF2 as illustrated in FIG. 4. The second groove GR2 of the second color filter CF2 may overlap the second emission area EA2 or the fourth emission area EA4.

In addition, a third groove GR3 which is concave may be defined in a lower surface of the third color filter CF3 as illustrated in FIG. 4. The third groove GR3 of the third color filter CF3 may overlap the third emission area EA3.

Since the first light blocking layer BM1 is substantially wide between the second emission area EA2 and the third emission area. EA3, a gap G may be defined between the second color filter CF2 and the third color filter CF3 as illustrated in FIG. 4. That is, the first light blocking layer BM1 may not overlap the second color filter CF2 and the third color filter CF3 in the third direction (Z-avis direction) in the gap G.

The support layer PL may be disposed on the color filter layer CFL. The support layer PL may include the first organic material.

The separation layer SL may be disposed on the support layer PL. The separation layer SL may include the second organic material different from the first organic material. The second organic material may be a material having lower peel strength than the first organic material. In an embodiment, the peel strength of the separation layer SL may be about 1 Newton (N) per 25 millimeter (mm) (i.e., 1N/25 mm), for example.

In an embodiment, each of the first organic material and the second organic material may include at least one of polyimide, polyvinyl alcohol, polyamic acid, polyamide, polyethylene, polystyrene, polynorbornene, phenylmaleimide copolymer, polyazobenzene, polyphenylenephthalamide, polyester, polymethyl methacrylate, polyarylate, cinnamate-based polymer, coumarin-based polymer, phthalimidine-based polymer, chalcone-based polymer, and aromatic acetylene-based polymer. In the embodiment, the second organic material may further include a fluorine compound to lower the peel strength of the separation layer SL.

The adhesion between the support layer PL and the color filter layer CFL may be greater than the adhesion between the support layer PL and the separation layer SL. Therefore, the separation layer SL may be separated from the support layer PL during the process of fabricating the display device. Here, a part of the separation layer SL may remain on a surface of the support layer PL, and a thickness of the separation layer SL may be smaller than a thickness of the support layer PL. In an alternative embodiment, the separation layer SL may not remain on the surface of the support layer PL.

The support layer PL and the separation layer SL will be described in detail later with reference to FIGS. 19 through 24.

The second adhesive member AHL2 may be disposed on the separation layer SL or the support layer PL. The second adhesive member AHL2 bonds the separation layer SL or the support layer PL to the cover window CW. In an embodiment, the second adhesive member AHL2 may be a transparent adhesive member such as an OCA film or an OCR.

The cover window CW may be disposed on the second adhesive member AHL2. The cover window CW protects the upper surface of the display device 10. In an embodiment, the cover window CW may be an inorganic material such as glass or an organic material such as plastic or a polymer material.

As illustrated in FIG. 4, in order to reduce reflection of external light by the metal lines of the display panel 100, not a polarizing plate but the color filter layer CFL including the color filters and the first light blocking layer BM1 may be attached onto the display panel 100. In this case, no new facility is desired to directly form the color filter layer CFL on the display panel 100, and a material with a lower unit cost than a material used in a low-temperature process may be used. Therefore, an increase in fabrication cost may be prevented or minimized.

Figure 5:
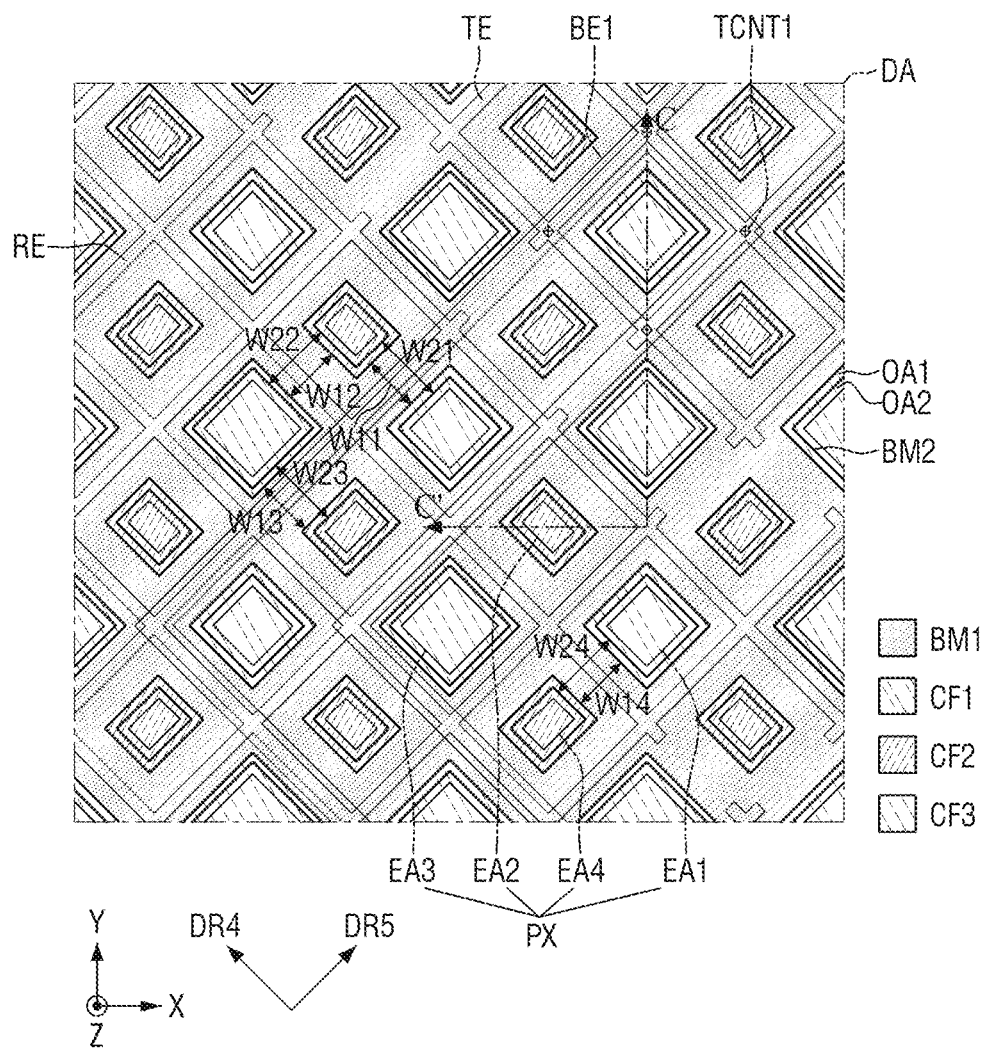
FIG. 5 is a plan view of an embodiment of a display area of a display device.
Figure 6:
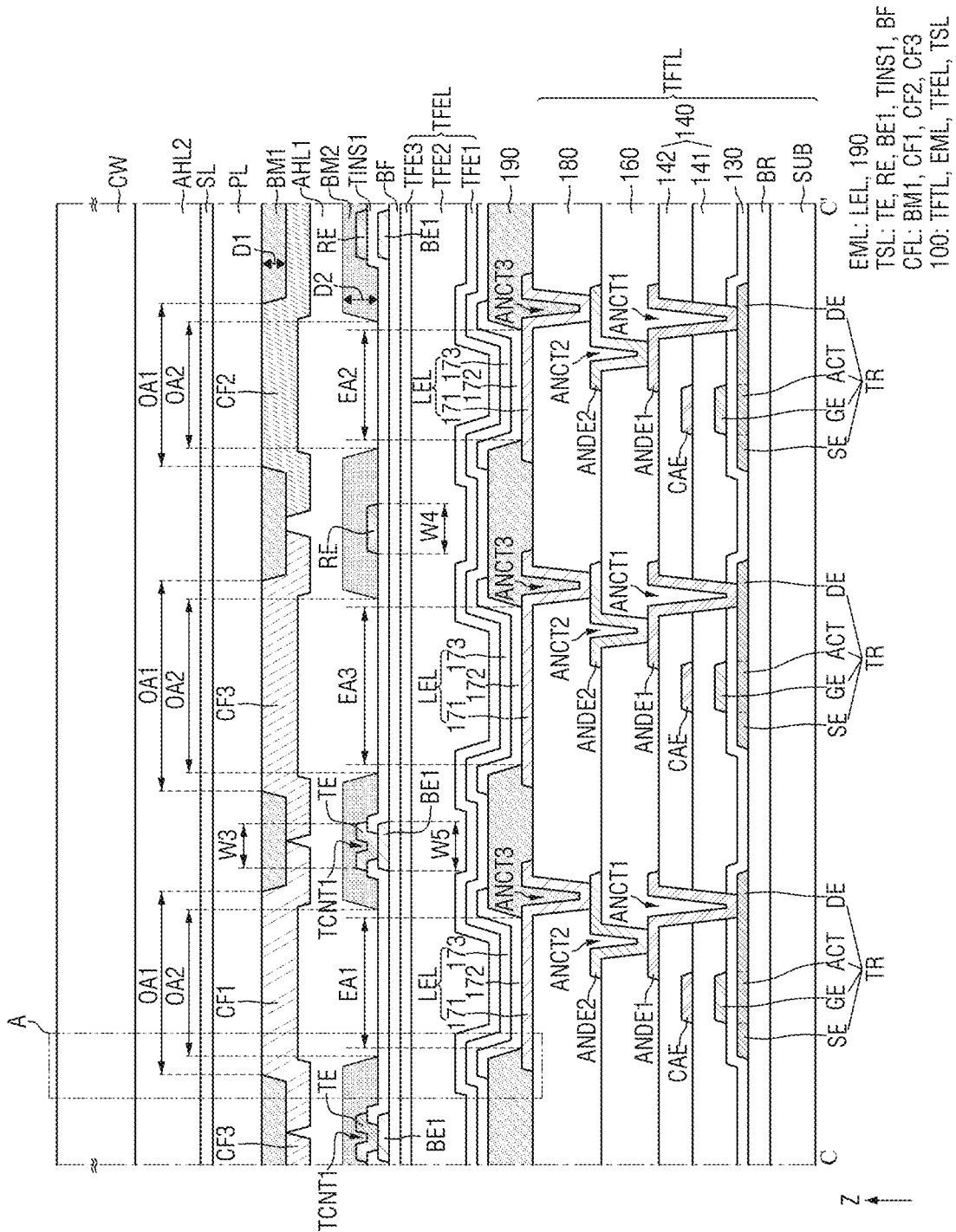
FIG. 6 is a cross-sectional view of an embodiment of the display device taken along line C-C' of FIG. 5.

FIG. 5 is a plan view of an embodiment of a display area of a display device 10. FIG. 6 is a cross-sectional view of an embodiment of the display device 10 taken along line C-C' of FIG. 5.

The embodiment of FIGS. 5 and 6 is different from the embodiment of FIGS. 3 and 4 in that a second light blocking layer BM2 is added. In FIGS. 5 and 6, differences from the embodiment of FIGS. 3 and 4 will be mainly described.

Referring to FIGS. 5 and 6, the second light blocking layer BM2 may be disposed between a first emission area EA1 and a second emission area EA2, between the second emission area EA2 and a third emission area EA3, between the third emission area EA3 and a fourth emission area EA4, and between the first emission area EA1 and the fourth emission area EA4.

The second light blocking layer BM2 may be overlapped by a first light blocking layer BM1 in the third direction (Z-axis direction). The second light blocking layer BM2 may overlap driving electrodes TE, sensing electrodes RE, and a connection electrode BE1 in the third direction (Z-axis direction).

The second light blocking layer BM2 may include a light absorbing material to lower the transmittance of light. In an embodiment, the second light blocking layer BM2 may include an inorganic black pigment such as carbon black or an organic black pigment. The second light blocking layer BM2 may include the same material as that of the first light blocking layer BM1 and a bank 190, for example.

The optical density of the second light blocking layer BM2 may be higher than the optical density of the first light blocking layer BM1. The higher the optical density, the lower the transmittance of light. Therefore, the light transmittance of the second light blocking layer BM2 may be lower than the light transmittance of the first light blocking layer BM1. The light absorption rate of the second light blocking layer BM2 may be higher than the light absorption rate of the first light blocking layer BM1. To this end, a thickness D2 of the second light blocking layer BM2 may be greater than a thickness D1 of the first light blocking layer BM1. In addition, a weight ratio of an inorganic black pigment or an organic black pigment included in the second light blocking layer BM2 may be greater than a weight ratio of an inorganic black pigment or an organic black pigment included in the first light blocking layer BM1.

Second opening areas OA2 may be defined by the second light blocking layer BM2. The second opening areas OA2 may be areas in which the second light blocking layer BM2 is not disposed. Each of the second opening areas OA2 may overlap the first emission area EA1, the second emission area EA2, the third emission area EA3, and the fourth emission area EA4. The area of each of the second opening areas OA2 may be different from the area of a first opening area OA1 overlapping the second opening area OA2. In an embodiment, the area of each of the second opening areas OA2 may be less than the area of a first opening area OA1 overlapping the second opening area OA2, for example.

Since the area of the third emission area EA3 is the largest, the area of each of first opening areas OA1 overlapping the third emission areas EA3 in the third direction (Z-axis direction) among the first opening areas OA1 may be the largest. Since the area of the second emission area. EA2 and the area of the fourth emission area EA4 are the smallest, the area of each of first opening areas OA1 overlapping the second emission areas EA2 and the fourth emission areas EA4 in the third direction (Z-axis direction) among the first opening areas OA1 may be the smallest.

In addition, since the area of the third emission area EA3 is the largest, the area of each of second opening areas OA2 overlapping the third emission areas EA3 in the third direction (Z-axis direction) among the second opening areas OA2 may be the largest. Since the area of the second emission area EA2 and the area of the fourth emission area EA4 are the smallest, the area of each of second opening areas OA2 overlapping the second emission areas EA2 and the fourth emission areas EA4 in the third direction (Z-axis direction) among the second opening areas OA2 may be the smallest.

Minimum widths W21 through W24 of the second light blocking layer BM2 may be greater than minimum widths W11 through W14 of the first light blocking layer BM1 overlapping the second light blocking layer BM2 in the third direction (Z-axis direction). The minimum widths W21 through W24 of the second light blocking layer BM2 may be greater than a width. W3 of the driving electrodes TE, a width W4 of the sensing electrodes RE, and a width W5 of the connection electrode BE1 overlapped by the second light blocking layer BM2 in the third direction (Z-axis direction).

In FIGS. 5 and 6, the minimum widths W11 through W14 of the first light blocking layer BM1 are greater than the width W3 of the driving electrodes TE, the width W4 of the sensing electrodes RE, and the width W5 of the connection electrode BE1 overlapped by the first light blocking layer BM1 in the third direction (Z-axis direction). Since the width W3 of the driving electrodes TE, the width W4 of the sensing electrodes RE, and the width W5 of the connection electrode BE1 are smaller than the minimum widths W21 through W24 of the second light blocking layer BM2, the driving electrodes TE, the sensing electrodes RE, and the connection electrode BE1 may be covered by the second light blocking layer BM2. In another embodiment, the width W3 of the driving electrodes TE, the width W4 of the sensing electrodes RE, and the width W5 of the connection electrode BE1 overlapped by the first light blocking layer BM1 in the third direction (Z-axis direction) may be greater than the minimum widths W11 through W14 of the first light blocking layer BM1 while being smaller than the minimum widths W21 through W24 of the second light blocking layer BM2.

The area of the first emission area EA1, the area of the second emission area EA2, and the area of the third emission area EA3 are different from each other. Therefore, the minimum width W11 of the first light blocking layer BM1 disposed between the first emission area EA1 and the second emission area EA2, the minimum width W12 of the first light blocking layer BM1 disposed between the second emission area EA2 and the third emission area EA3, the minimum width W13 of the first light blocking layer BM1 disposed between the third emission area EA3 and the fourth emission area EA4, and the minimum width W14 of the first light blocking layer BM1 disposed between the first emission area EA1 and the fourth emission area EA4 may be different from each other. In addition, the minimum width W21 of the second light blocking layer BM2 disposed between the first emission area EA1 and the second emission area EA2, the minimum width W22 of the second light blocking layer BM2 disposed between the second emission area EA2 and the third emission area EA3, the minimum width W23 of the second light blocking layer BM2 disposed between the third emission area EA3 and the fourth emission area EA4, and the minimum width W24 of the second light blocking layer BM2 disposed between the first emission area EA1 and the fourth emission area EA4 may be different from each other.

In an embodiment, the area of the third emission area EA3 may be the largest, and the area of the second emission area EA2 may be the smallest, for example. In this case, the minimum width W11 of the first light blocking layer BM1 disposed between the first emission area EA1 and the second emission area EA2 and the minimum width W14 of the first light blocking layer BM1 disposed between the first emission area EA1 and the fourth emission area EA4 may be greater than the minimum width W12 of the first light blocking layer BM1 disposed between the second emission area EA2 and the third emission area EA3 and the minimum width W13 of the first light blocking layer BM1 disposed between the third emission area EA3 and the fourth emission area EA4. In addition, the minimum width W11 of the first light blocking layer BM1 disposed between the first emission area EA1 and the second emission area EA2 and the minimum width W14 of the first light blocking layer BM1 disposed between the first emission area EA1 and the fourth emission area EA4 may be substantially equal. In addition, the minimum width W12 of the first light blocking layer BM1 disposed between the second emission area EA2 and the third emission area EA3 and the minimum width W13 of the first light blocking layer BM1 disposed between the third emission area EA3 and the fourth emission area EA4 may be substantially equal.

Further, the minimum width W21 of the second light blocking layer BM2 disposed between the first emission area EA1 and the second emission area EA2 and the minimum width W24 of the second light blocking layer BM2 disposed between the first emission area EA1 and the fourth emission area EA4 may be greater than the minimum width W22 of the second light blocking layer BM2 disposed between the second emission area EA2 and the third emission area EA3 and the minimum width W23 of the second light blocking layer BM2 disposed between the third emission area EA3 and the fourth emission area EA4. In addition, the minimum width W21 of the second light blocking layer BM2 disposed between the first emission area EA1 and the second emission area EA2 and the minimum width W24 of the second light blocking layer BM2 disposed between the first emission area EA1 and the fourth emission area EA4 may be substantially equal. In addition, the minimum width W22 of the second light blocking layer BM2 disposed between the second emission area EA2 and the third emission area EA3 and the minimum width W23 of the second light blocking layer BM2 disposed between the third emission area EA3 and the fourth emission area EA4 may be substantially equal.

When the first emission area EA1 and the second emission area EA2 are disposed in the fourth direction DR4 as illustrated in FIG. 5, the minimum width W11 of the first light blocking layer BM1 and the minimum width W21 of the second light blocking layer BM2 disposed between the first emission area EA1 and the second emission area EA2 may be the width of the first light blocking layer BM1 and the width of the second light blocking layer BM2 in the fourth direction DR4, respectively. In addition, when the second emission area EA2 and the third emission area EA3 are disposed in the fifth direction DR5 as illustrated in FIG. 5, the minimum width W12 of the first light blocking layer BM1 and the minimum width W22 of the second light blocking layer BM2 disposed between the second emission area EA2 and the third emission area EA3 may be the width of the first light blocking layer BM1 and the width of the second light blocking layer BM2 in the fifth direction DR5, respectively. In addition, when the third emission area EA3 and the fourth emission area EA4 are disposed in the fourth direction DR4 as illustrated in FIG. 5, the minimum width W13 of the first light blocking layer BM1 and the minimum width W23 of the second light blocking layer BM2 disposed between the third emission area EA3 and the fourth emission area EA4 may be the width of the first light blocking layer BM1 and the width of the second light blocking layer BM2 in the fourth direction DR4, respectively. When the first emission area EA1 and the fourth emission area EA4 are disposed in the fifth direction DR5 as illustrated in FIG. 5, the minimum width W14 of the first light blocking layer BM1 and the minimum width W24 of the second light blocking layer BM2 disposed between the first emission area EA1 and the fourth emission area EA4 may be the width of the first light blocking layer BM1 and the width of the second light blocking layer BM2 in the fifth direction DR5, respectively.

As illustrated in FIGS. 5 and 6, since a distance between a light emitting layer 172 and the second light blocking layer BM2 is smaller than a distance between the light emitting layer 172 and the first light blocking layer BM1, when the display device 10 includes the first light blocking layer BM1 and the second light blocking layer BM2, an angle at which light emitted from the light emitting layer 172 travels to the side in each of the first to fourth emission areas EA1 through EA4 may be greater than when the display device 10 includes only the first light blocking layer BM1. That is, a viewing angle of the display device 10 may be widened. The viewing angle of the display device 10 indicates an angle at which an image may be seen on the display device 10.

A horizontal distance L2 from the first emission area EA1 to the first light blocking layer BM1 and a horizontal distance L1 from the first emission area EA1 to the second light blocking layer BM2 for widening the viewing angle of the display device 10 will now be described in detail with reference to FIG. 7. A horizontal distance L2 from the second emission area EA2 to the first light blocking layer BM1, a horizontal distance L2 from the third emission area EA3 to the first light blocking layer BM1 and a horizontal distance L2 from the fourth emission area EA4 to the first light blocking layer BMA may be substantially equal to the horizontal distance L2 from the first emission area EA1 to the first light blocking layer BM1, and a horizontal distance E1 from the second emission area EA2 to the second light blocking layer BM2, horizontal distance L1 from the third emission area EA3 to the second light blocking layer BM2, and a horizontal distance L1 from the fourth emission area EA4 to the second light blocking layer BM2 may be substantially equal to the horizontal distance L1 from the first emission area EA1 to the second light blocking layer BM2 described with reference to FIG. 7, and thus a description thereof will be omitted.

Figure 7:
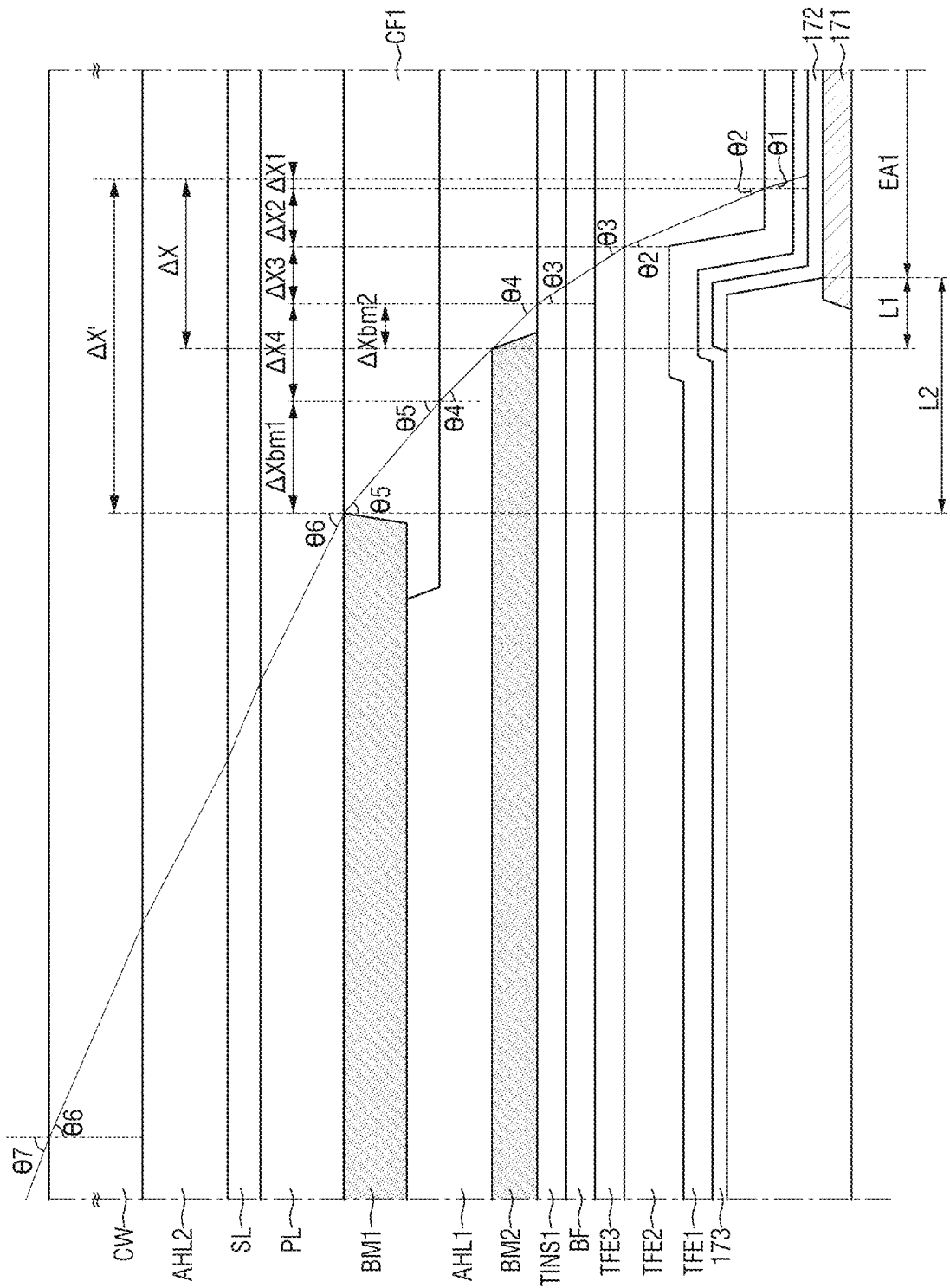
FIG. 7 is an enlarged cross-sectional view illustrating area A of FIG. 6 in detail.

FIG. 7 is an enlarged cross-sectional view illustrating area A of FIG. 6 in detail.

Referring to FIG. 7, light emitted from the light emitting layer 172 may pass through a common electrode 173, a first encapsulating inorganic layer TFE1, an encapsulating organic layer TFE2, a second encapsulating inorganic layer TFE3, a buffer layer BF, a touch insulating layer TINS1, a first adhesive member AHL1, a first color filter CF1, a support layer PL, a separation layer SL, a second adhesive member AHL2, and a cover window CW to exit out of the display device 10.

Light L emitted from the light emitting layer 172 may be refracted by Snell's law at interfaces corresponding to boundaries of the layers. In an embodiment, the light L emitted from the light emitting layer 172 may be refracted by Snell's law at an interface between the first encapsulating inorganic layer TFE1 and the encapsulating organic layer TFE2, an interface between the encapsulating organic layer TFE2 and the second encapsulating inorganic layer TFE3, an interface between the touch insulating layer TINS1 and the first adhesive member AHL1, an interface between the first adhesive member AHL1 and the first color filter CF1, and an interface between the cover window CW and an air layer, for example. The light L emitted from the light emitting layer 172 may also be refracted by Snell's law at an interface between the common electrode 173 and the first encapsulating inorganic layer TFE1, an interface between the second encapsulating inorganic layer TFE3 and the buffer layer BF, an interface between the buffer layer BF and the touch insulating layer TINS1, an interface between the first color filter CF1 and the support layer PL, an interface between the support layer PL and the separation layer SL, an interface between the separation layer SL and the second adhesive member AHL2, and an interface between the second adhesive member AHL2 and the cover window CW, for example. However, since refraction at the above interfaces is insignificant due to the matching of refractive indices, it is omitted herein for ease of description.

A refractive index of the first encapsulating inorganic layer TFE1 may be defined as n1, a refractive index of the encapsulating organic layer TFE2 as n2, refractive indices of the second encapsulating inorganic layer TFE3 and the touch insulating layer TINS1 as n3, a refractive index of the first adhesive member AHL1 as n4, a refractive index of the first color filter CF1 as n5, a refractive index of the support layer PL and a refractive index of the cover window CW as n6, and a refractive index of the air layer as n7. In addition, an incident angle of the light L and a refraction angle of the light L at the interface between the first encapsulating inorganic layer TFE1 and the encapsulating organic layer TFE2 may be defined as θ1 and θ2, respectively, the incident angle of the light L and the refraction angle of the light L at the interface between the encapsulating organic layer TFE2 and the second encapsulating inorganic layer TFE3 may be defined as θ2 and θ3, respectively, the incident angle of the light L and the refraction angle of the light L at the interface between the touch insulating layer TINS1 and the first adhesive member AHL1 may be defined as θ3 and θ4, respectively, the incident angle of the light L and the refraction angle of the light L at the interface between the first adhesive member AHL1 and the first color filter CF1 may be defined as θ4 and θ5, respectively, the incident angle of the light L and the refraction angle of the light L at the interface between the first color filter CF1 and the support layer PL may be defined as θ5 and θ6, respectively, and the incident angle of the light L and the refraction angle of the light L at the interface between the cover window CW and the air layer may be defined as θ6 and θ7, respectively. In this case, n1 through n7 and θ1 through θ7 may be defined as in Equation 1:

$n1 \cdot \sin θ1 = n2 \cdot \sin θ2,$ $n2 \cdot \sin θ2 = n3 \cdot \sin θ3,$ $n3 \cdot \sin θ3 = n4 \cdot \sin θ4,$ $n4 \cdot \sin θ4 = n5 \cdot \sin θ5,$ $n5 \cdot \sin θ5 = n6 \cdot \sin θ6,$ $n6 \cdot \sin θ6 = n7 \cdot \sin θ7$ (1)

In Equation 1, the refractive index n6 of the cover window CW may be calculated as in Equation 2:

$$n6 = n7 \cdot \frac{\sin θ7}{\sin θ6}. \tag{2}$$

In addition, in Equation 1, the refractive index n5 of the first color filter CF1 and the refraction angle θ5 of the light L at the interface between the first adhesive member AHL1 and the first color filter CF1 may be calculated as in Equation 3:

$$n5 = n6 \cdot \frac{\sin θ6}{\sin θ5} = n7 \cdot \frac{\sin θ7}{\sin θ5}, \; θ5 = \sin^{-1}\left(\frac{n7}{n5} \cdot \sin θ7\right). \tag{3}$$

In a similar manner, the refractive index n4 of the first adhesive member AHL1 and the refraction angle θ4 of the light L at the interface between the touch insulating layer TINS1 and the first adhesive member AHL1 may be calculated as in Equation 4:

$$n4 = n5 \cdot \frac{\sin θ5}{\sin θ4} = n7 \cdot \frac{\sin θ7}{\sin θ4}, \; θ4 = \sin^{-1}\left(\frac{n7}{n4} \cdot \sin θ7\right). \tag{4}$$

In addition, in a similar manner, the refractive index n3 of the second encapsulating inorganic layer TFE3 and the refraction angle θ3 of the light L at the interface between the encapsulating organic layer TFE2 and the second encapsulating inorganic layer TFE3 may be calculated as in Equation 5:

$$n3 = n4 \cdot \frac{\sin θ4}{\sin θ3} = n7 \cdot \frac{\sin θ7}{\sin θ3}, \; θ3 = \sin^{-1}\left(\frac{n7}{n3} \cdot \sin θ7\right). \tag{5}$$

In addition, in a similar manner, the refractive index n2 of the encapsulating organic layer TFE2 and the incident angle θ2 of the light L at the interface between the first encapsulating inorganic layer TFE1 and the encapsulating organic layer TFE2 may be calculated as in Equation 6:

$$n2 = n3 \cdot \frac{\sin θ3}{\sin θ2} = n7 \cdot \frac{\sin θ7}{\sin θ2}, \; θ2 = \sin^{-1}\left(\frac{n7}{n2} \cdot \sin θ7\right). \tag{6}$$

In addition, in a similar manner, the refractive index n1 of the first encapsulating inorganic layer TFE1 and the incident angle θ1 of the light L at the interface between the first encapsulating inorganic layer TFE1 and the encapsulating organic layer TFE2 may be calculated as in Equation 7:

$$n1 = n2 \cdot \frac{\sin θ2}{\sin θ1} = n7 \cdot \frac{\sin θ7}{\sin θ1}, \; θ1 = \sin^{-1}\left(\frac{n7}{n1} \cdot \sin θ7\right). \tag{7}$$

The distance L1 that the light L emitted from the light emitting layer 172 travels to the second light blocking layer BM2 in a horizontal direction parallel to a substrate SUB may be greater than a distance ΔX of FIG. 7. The distance ΔX of FIG. 7 may include a distance ΔX1 that the light L moves in the horizontal direction within the first encapsulating inorganic layer TFE1, a distance ΔX2 that the light L moves in the horizontal direction within the encapsulating organic layer TFE2, a distance ΔX3 that the light L moves in the horizontal direction within the second encapsulating inorganic layer TFE3 or the touch insulating layer TINS1 and a distance ΔXbm2 that the light L moves in the horizontal direction within the first adhesive member AHL1 and may be summarized into Equation 8:

$$\Delta X = \sum_{i=1}^{3} \Delta Xi + \Delta Xbm2 = \sum_{i=1}^{3} di \cdot \tan\theta i + dbm2 \cdot \tan\theta 4. \quad (8)$$

Similarly, a distance ΔX' of FIG. 7 may include the distance ΔX1 that the light L moves in the horizontal direction within the first encapsulating inorganic layer TFE1, the distance ΔX2 that the light L moves in the horizontal direction within the encapsulating organic layer TFE2, the distance ΔX3 that the light L moves in the horizontal direction within the second encapsulating inorganic layer TFE3 or the touch insulating layer TINS1, a distance ΔX4 that the light L moves in the horizontal direction within the first adhesive member AHL1, and a distance ΔXbm1 that the light L moves in the horizontal direction within the first color filter CF1 and may be summarized into Equation 9:

$$\Delta X' = \sum_{i=1}^{5} \Delta Xi = \sum_{i=1}^{5} di \cdot \tan\theta i. \quad (9)$$

Here, according to Equations 1 through 7, θi may be calculated as in Equation 10:

$$\theta i = \sin^{-1} \frac{n7}{ni} \cdot \sin\theta 7. \quad (10)$$

When Equation 10 is substituted for Equation 8, the horizontal distance L1 from the first emission area EA1 to the second light blocking layer BM2 may be calculated as in Inequality 11:

$$L1 \geq \sum_{i=1}^{3} di \cdot \tan\left(\sin^{-1}\left(\frac{n7}{ni} \cdot \sin\theta 7\right)\right) + dbm2 \cdot \tan\left(\sin^{-1}\left(\frac{n7}{n4} \cdot \sin\theta 7\right)\right). \quad (11)$$

When Equation 10 is substituted for Equation 9, the horizontal distance L2 from the first emission area EA1 to the first light blocking layer BM1 may be calculated as in Inequality 12:

$$L2 \geq \sum_{i=1}^{5} di \cdot \tan\left(\sin^{-1}\left(\frac{n7}{ni} \cdot \sin\theta 7\right)\right). \quad (12)$$

As illustrated in FIG. 7, the horizontal distance L1 from the first emission area EA1 to the second light blocking layer BM2 may be smaller than the horizontal distance L2 from the first emission area EA1 to the first light blocking layer BM1.

Figure 8:
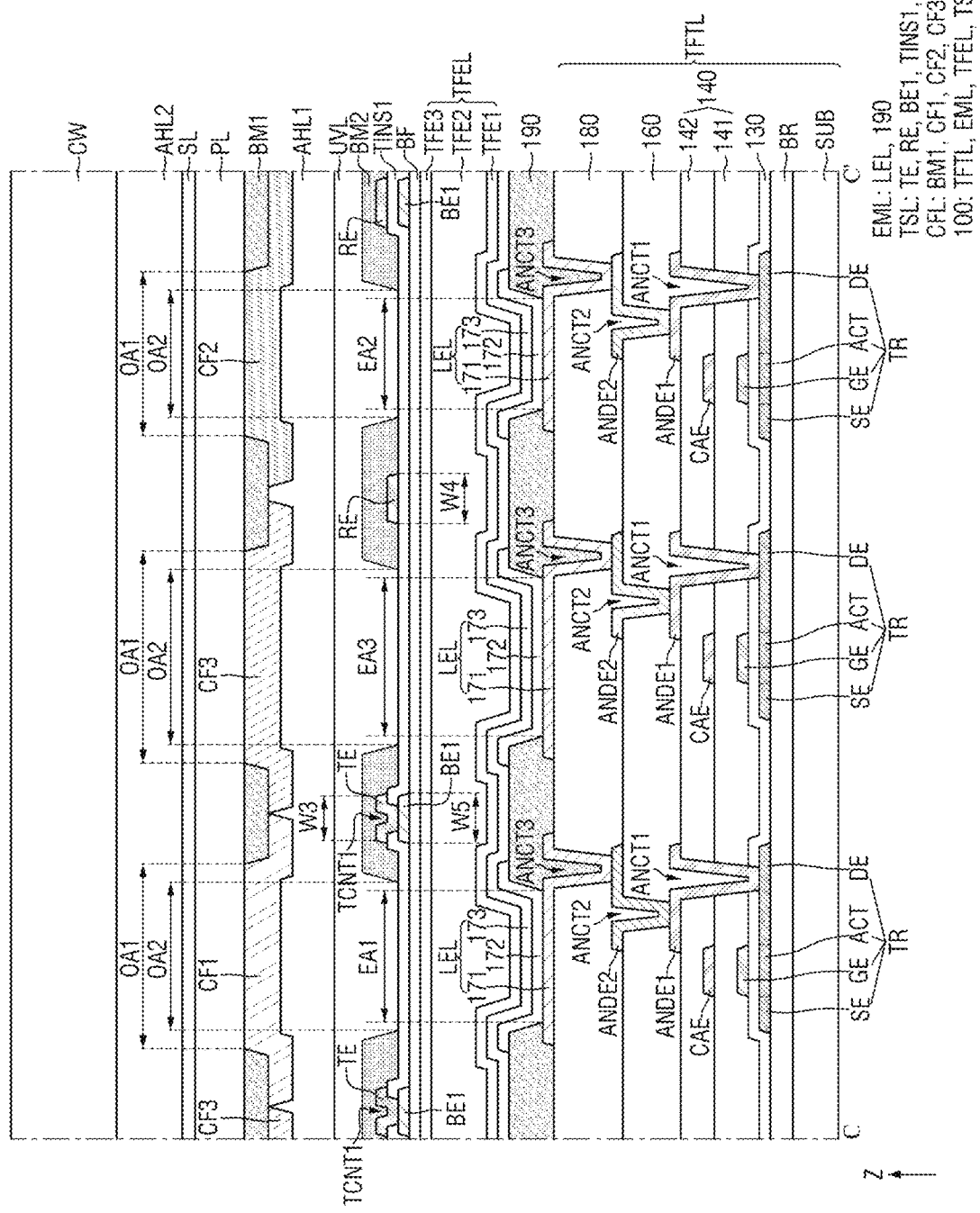
FIG. 8 is a cross-sectional view of an embodiment of the display device taken along line C-C' of FIG. 5.

FIG. 8 is a cross-sectional view of an embodiment of the display device 10 taken along line C-C' of FIG. 5.

The embodiment of FIG. 8 is different from the embodiment of FIG. 6 in that an ultraviolet absorbing layer UVL is disposed on a second light blocking layer BM2. In FIG. 8, differences from the embodiment of FIG. 6 will be mainly described.

Referring to FIG. 8, the ultraviolet absorbing layer UVL may be disposed between the second light blocking layer BM2 and a first adhesive member AHL1. In an embodiment, the ultraviolet absorbing layer UVL may include a material in which an ultraviolet absorbing material is added to a matrix material such as acrylic resin, methacrylic resin, isoprene resin, vinyl resin, epoxy resin, urethane resin, cellulose resin, perylene resin, or imide resin. The ultraviolet absorbing material may be cross-linked to the matrix material.

In an embodiment, the ultraviolet absorbing material may absorb light having a wavelength of about 200 nm to about 400 nm. In an embodiment, the ultraviolet absorbing material may include at least one of a benzophenone-based compound, a benzotriazole-based compound, a benzoate-based compound, a cyanoacrylate-based compound, a triazine-based compound, an oxanilide-based compound, and a salicylate-based compound, for example.

In an embodiment, the benzophenone-based compound may include at least one of 2, 4-dihydroxybenzophenone, 2-hydroxy-4-methoxybenzophenone, 2-hydroxy-4-octyl-benzophenone, 4-dodecyloxy-2-hydroxybenzophenone, 4-benzyloxy-2-hydroxybenzophenone, 2, 2', 4, 4'-tetrahydroxybenzophenone, and 2, 2'-dihydroxy4, 4'-dimethoxybenzophenone.

In an embodiment, the benzotriazole-based compound may include at least one of 2-(5-methyl-2-hydroxyphenyl)benzotriazole, 2-[2-hydroxy-3, 5-bis(α, α-dimethylbenzyl)phenyl]-2H-benzotriazole, 2-(3-5-di-t-butyl-2-hydroxyphenyl)benzotriazole, 2-(3-t-butyl-5-methyl-2-hydroxyphenyl)-5-chlorobenzotriazole, 2-(3, 5-di-t-butyl-2-hydroxyphenyl)-5-chlorobenzotriazole, 2-(3, 5-di-t-acyl-2-hydroxyphenyl)benzotriazole, and 2-(2'-hydroxy5'-t-octylphenyl)benzotriazole.

In an embodiment, the benzoate-based compound may include at least one of 2, 4-di-t-butylphenyl-3', 5'-di-t-butyl-4-hydroxybenzoate.

In an embodiment, the triazine-based compound may include at least one of 2-[4-[(2-hydroxy-3-dodecyloxypropyl)oxy]-2-hydroxyphenyl]-4, 6-bis(2, 4-dimethylphenyl)1, 3, 5-triazine.

In an embodiment, the salicylate-based compound may include at least one of phenyl salicylate and 4-t-butylphenyl salicylate.

Since the light transmittance of a color filter layer CFL is higher than the light transmittance of a polarizing plate, when the display device 10 includes the color filter layer CFL instead of the polarizing plate, more light may be incident on emission areas EA1 through EA4 from the outside. When the display device 10 includes the ultraviolet absorbing layer UVL, a reduction in the reliability of the first to fourth emission areas EA1 through EA4 of the display device 10 by light incident from the outside may be prevented.

In FIG. 8, the ultraviolet absorbing layer UVL is disposed between the second light blocking layer BM2 and the first adhesive member AHL1. However, embodiments of the specification are not limited thereto. In an embodiment, the first adhesive member AHL1 may include an ultraviolet absorbing material to absorb light having a wavelength of about 200 nm to about 400 nm, for example.

Figure 9:
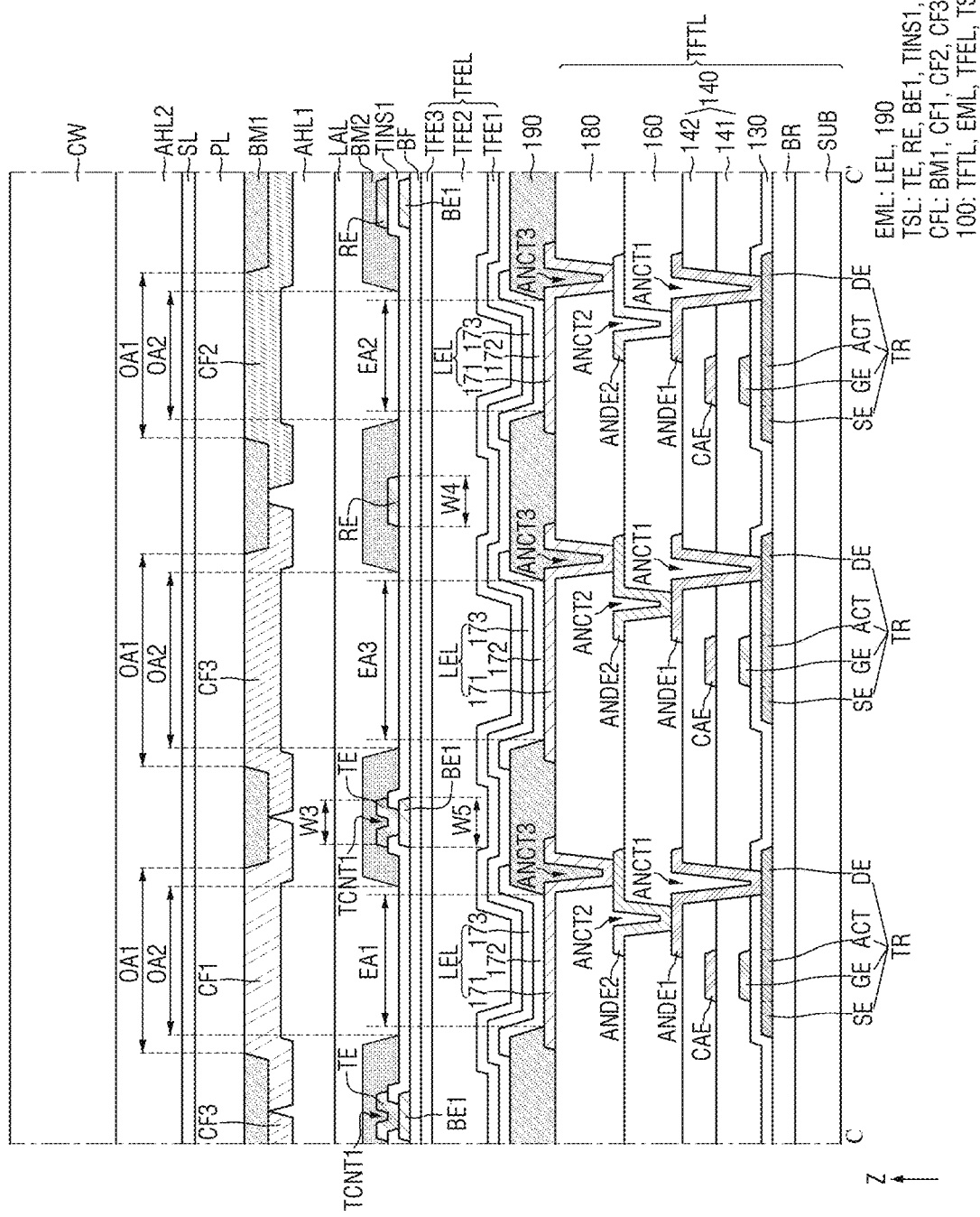
FIG. 9 is a cross-sectional view of an embodiment of the display device taken along line C-C' of FIG. 5.

FIG. 9 is a cross-sectional view of an embodiment of the display device 10 taken along line C-C' of FIG. 5.

The embodiment of FIG. 9 is different from the embodiment of FIG. 6 in that a light absorbing layer LAL is disposed on a second light blocking layer BM2. In FIG. 9, differences from the embodiment of FIG. 6 will be mainly described.

Referring to FIG. 9, the light absorbing layer LAL may be disposed between the second light blocking layer BM2 and a first adhesive member AHL1. The light absorbing layer LAL may include a dye or pigment that may absorb light in a predetermined wavelength range. The light absorbing layer LAL may include at least one dye or pigment or may include a combination of a plurality of dyes or pigments.

Figure 10:
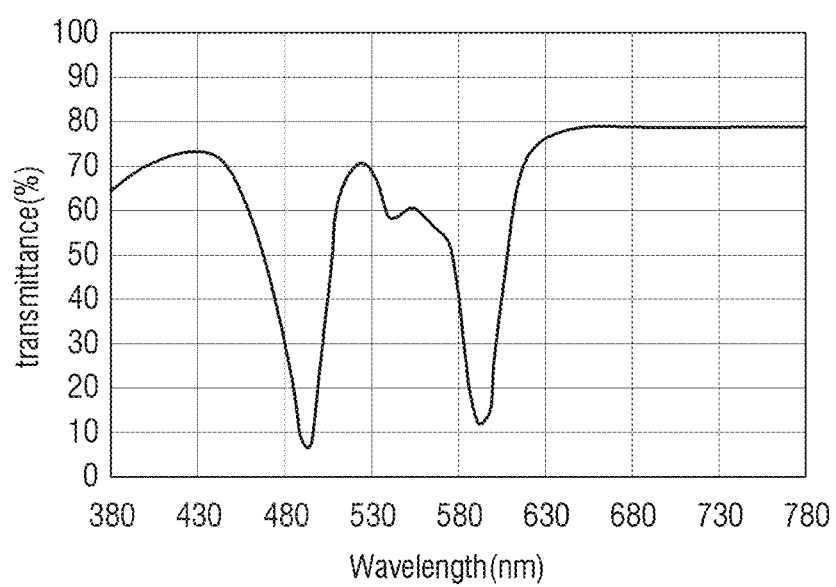
FIG. 10 is an example diagram illustrating a transmission wavelength band of a light absorbing layer.

The light absorbing layer LAL may selectively absorb light in a predetermined wavelength range as illustrated in FIG. 10. In FIG. 10, the X axis indicates the wavelength of light, and the Y axis indicates the transmittance of light. In an embodiment, the light absorbing layer LAL may absorb light of about 470 nm to about 510 nm and light of about 570 nm to about 610 nm to lower the light transmittance to about 50 percent (%) or less in about 470 nm to about 510 nm and about 570 nm to about 610 nm, for example. In this case, the color of external light reflected by metal lines of a display panel may be adjusted to red. In addition, the color of light emitted from the display device 10 may be adjusted to red.

Figure 11:
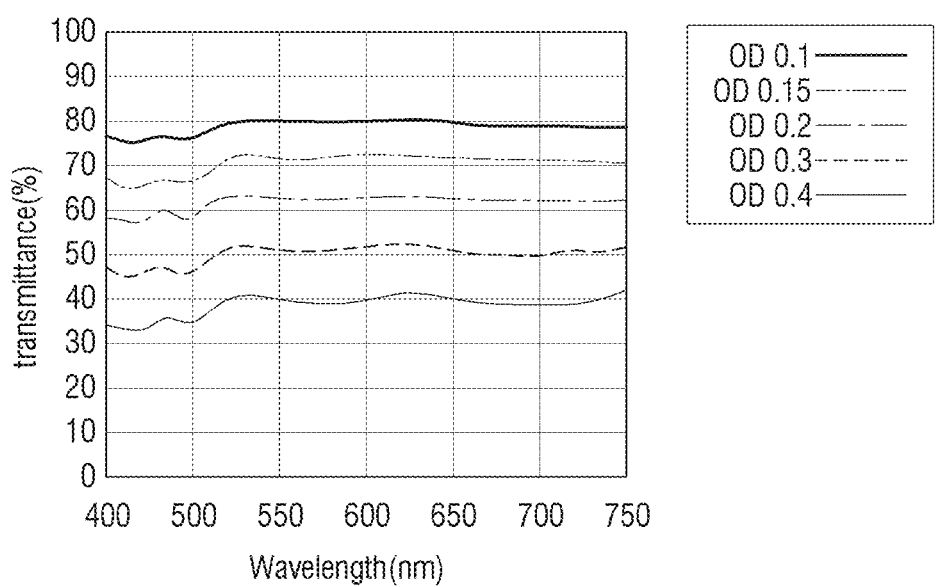
FIG. 11 is an example diagram illustrating a transmission wavelength band according to optical density when the light absorbing layer is a neutral density ("ND") filter.

In an alternative embodiment, the light absorbing layer LAL may be a neutral density ("ND") filter that lowers the overall transmittance of light in about 400 nm to about 750 nm as illustrated in FIG. 11 in order to lower the reflectance of external light. In FIG. 11, the X axis indicates the wavelength of light, the Y axis indicates the transmittance of light, and OD indicates optical density. As the optical density of the ND filter becomes higher, the transmittance of light becomes lower. Thus, the optical density of the ND filter may be set in consideration of the transmittance of light.

In FIG. 9, the light absorbing layer LAL is disposed between the second light blocking layer BM2 and the first adhesive member AHL1. However, embodiments of the specification are not limited thereto. In an embodiment, the first adhesive member AHL1 may include a dye or pigment that may absorb light to selectively absorb light in a predetermined wavelength range or lower the overall transmittance of light in about 400 nm to about 750 nm, for example.

Figure 12:
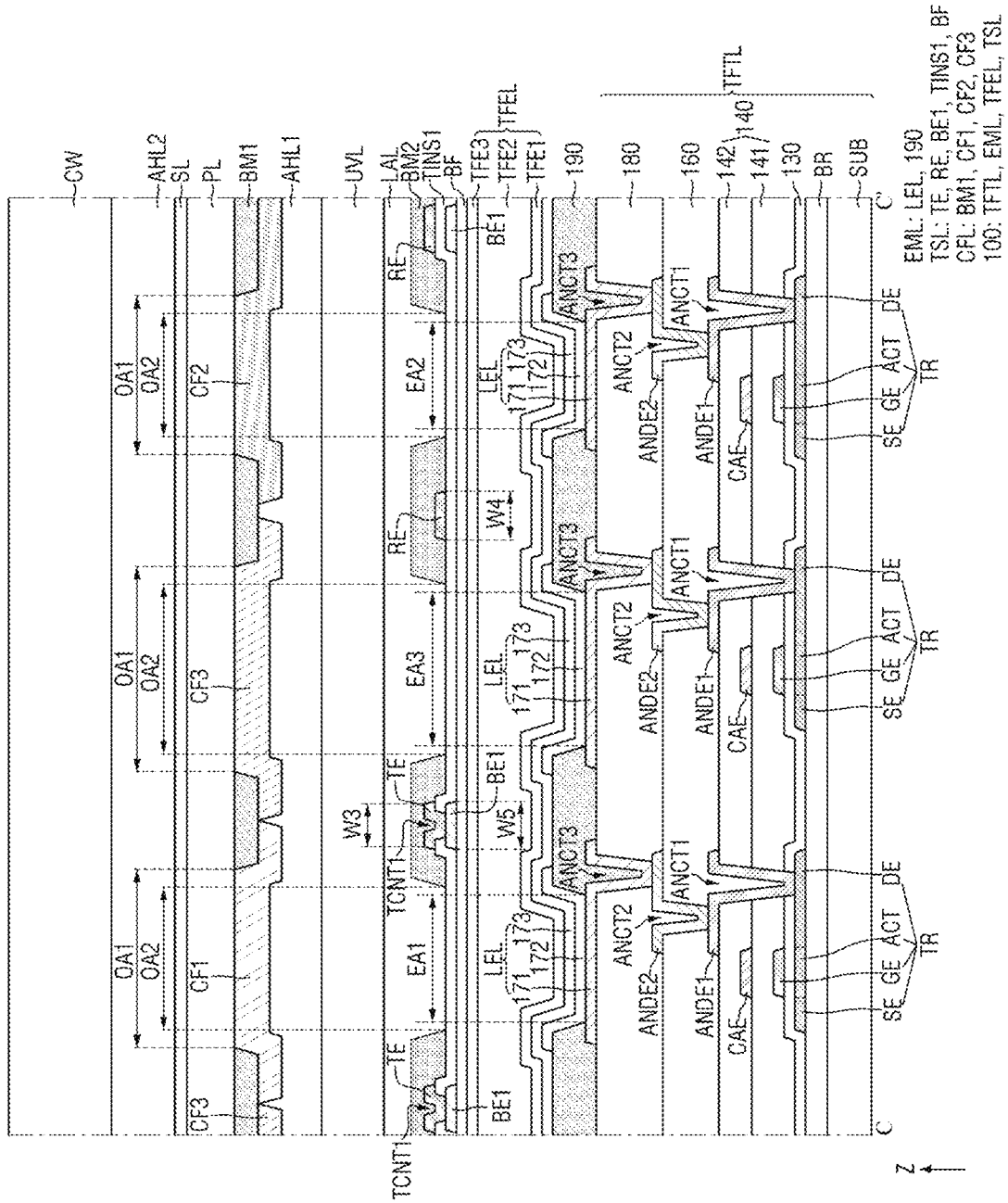
FIG. 12 is a cross-sectional view of an embodiment of the display device taken along line C-C' of FIG. 5.

FIG. 12 is a cross-sectional view of an embodiment of the display device 10 taken along line C-C' of FIG. 5.

The embodiment of FIG. 12 is different from the embodiment of FIG. 6 in that an ultraviolet absorbing layer UVL and a light absorbing layer LAL are disposed on a second light blocking layer BM2. The ultraviolet absorbing layer UVL is substantially the same as that described with reference to FIG. 8, and the light absorbing layer LAL is substantially the same as that described with reference to FIGS. 9 through 11. Therefore, a description of the embodiment of FIG. 12 is omitted.

Figure 13:
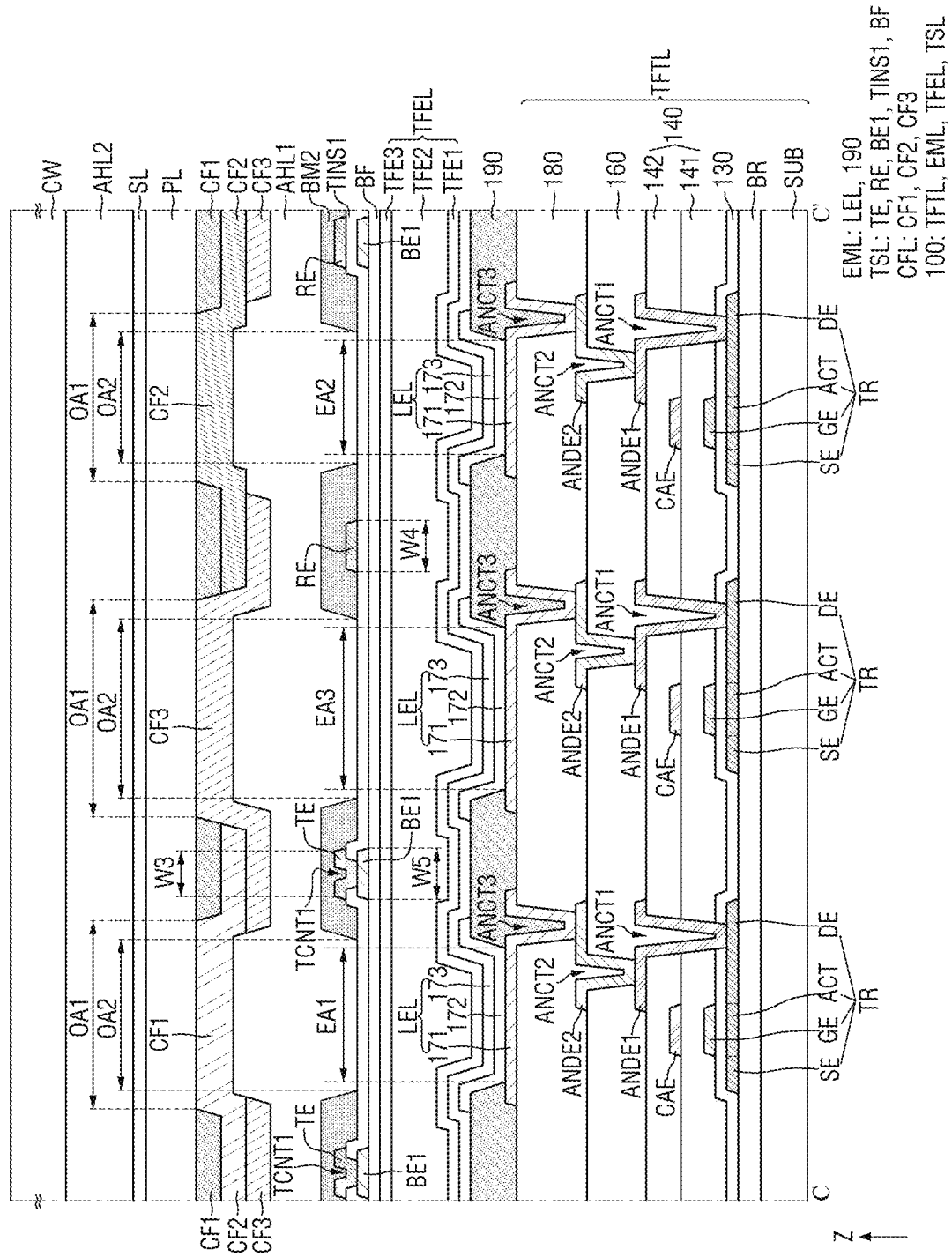
FIG. 13 is a cross-sectional view of an embodiment of the display device taken along line C-C' of FIG. 5.

FIG. 13 is a cross-sectional view of an embodiment of the display device 10 taken along line C-C' of FIG. 5.

The embodiment of FIG. 13 is different from the embodiment of FIG. 6 in that a first light blocking layer BM1 is omitted. In FIG. 13, differences from the embodiment of FIG. 6 will be mainly described.

Referring to FIG. 13, an overlap area of a first color filter CF1, a second color filter CF2 and a third color filter CF3 absorbs all of first light, second light and third light and thus plays substantially the same role as the first light blocking layer BM1 that does not transmit light. Therefore, not the first light blocking layer BM1 but the overlap area of the first color filter CF1, the second color filter CF2 and the third color filter CF3 may be disposed between a first emission area EA1 and a second emission area EA2, between the second emission area EA2 and a third emission area EA3, between the third emission area EA3 and a fourth emission area EA4, and between the first emission area EA1 and the fourth emission area EA4. That is, the overlap area of the first color filter CF1, the second color filter CF2, and the third color filter CF3 may not overlap the first emission area EA1, the second emission area EA2, the third emission area EA3 and the fourth emission area EA4 in the third direction (Z-axis direction).

The overlap area of the first color filter CF1, the second color filter CF2, and the third color filter CF3 may overlap a driving electrode TE, a sensing electrode RE, and a connection electrode BE1 in the third direction (Z-axis direction). In addition, the overlap area of the first color filter CF1, the second color filter CF2, and the third color filter CF3 may surround each of the first emission area EA1, the second emission area EA2, the third emission area EA3, and the fourth emission area EA4.

Figure 14:
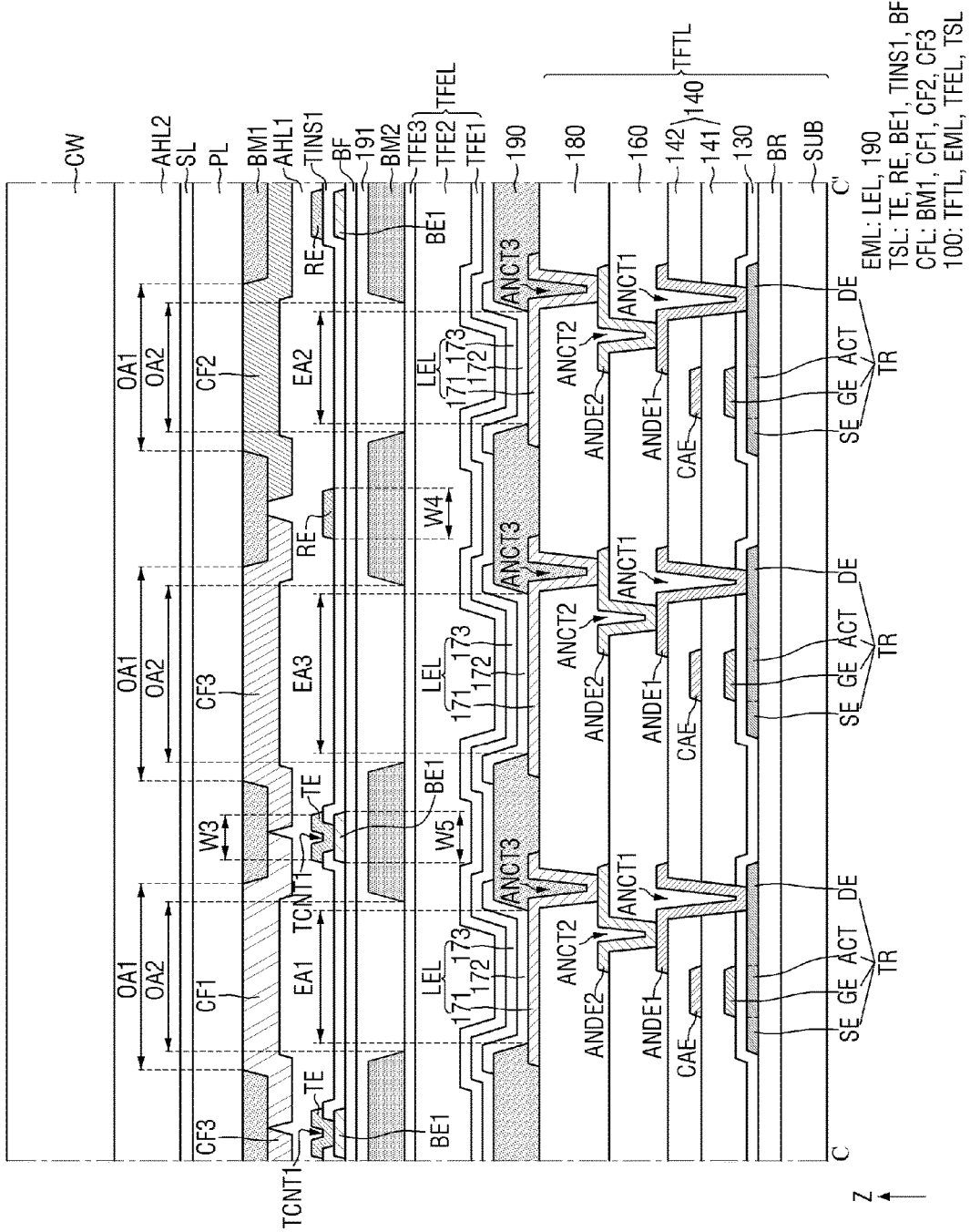
FIG. 14 is a cross-sectional view of an embodiment of the display device taken along line C-C' of FIG. 5.

FIG. 14 is a cross-sectional view of an embodiment of the display device 10 taken along line C-C' of FIG. 5.

The embodiment of FIG. 14 is different from the embodiment of FIG. 6 in that a second light blocking layer BM2 is disposed on an encapsulation layer TFEL, and a touch sensing layer TSL is disposed on the second light blocking layer BM2. In FIG. 14, differences from the embodiment of FIG. 6 will be mainly described.

Referring to FIG. 14, the second light blocking layer BM2 may be disposed on a second encapsulating inorganic layer TFE3 of the encapsulation layer TFEL. A third planarization layer 191 may be disposed on the second light blocking layer BM2 to planarize steps due to the second light blocking layer BM2. In an embodiment, the third planarization layer 191 may include or consist of an organic layer such as acryl resin, epoxy resin, phenolic resin, polyamide resin, or polyimide resin. The touch sensing layer TSL may be disposed on the third planarization layer 191.

As illustrated in FIG. 14, when the second light blocking layer BM2 is disposed between the encapsulation layer TFEL and the touch sensing layer TSL, a distance between a light emitting layer 172 and the second light blocking layer BM2 may be smaller than when the second light blocking layer BM2 is disposed on the touch sensing layer TSL. Therefore, an angle at which light emitted from the light emitting layer 172 travels to the side may be greater. That is, the viewing angle of the display device 10 may be wider.

In addition, as illustrated in FIG. 14, when the second light blocking layer BM2 is disposed between the encapsulation layer TEEL and the touch sensing layer TSL a distance between a driving electrode TE of the touch sensing layer TSL and a common electrode 173 and a distance between a sensing electrode RE and the common electrode 173 may be greater than when the second light blocking layer BM2 is disposed on the touch sensing layer TSL. Since parasitic capacitance between the driving electrode TE and the common electrode 173 is proportional to the distance between the driving electrode TE and the common electrode 173, when the second light blocking layer BM2 is disposed between the encapsulation layer TFEL and the touch sensing layer TSL, the parasitic capacitance between the driving electrode TE and the common electrode 173 may be smaller than when the second light blocking layer BM2 is disposed on the touch sensing layer TSL. In addition, when the second light blocking layer BM2 is disposed between the encapsulation layer TFEL and the touch sensing layer TSL, parasitic capacitance between the sensing electrode RE and the common electrode 173 may be smaller than when the second light blocking layer BM2 is disposed on the touch sensing layer TSL. Therefore, the touch sensitivity of the touch sensing layer TSL may increase.

Figure 15:
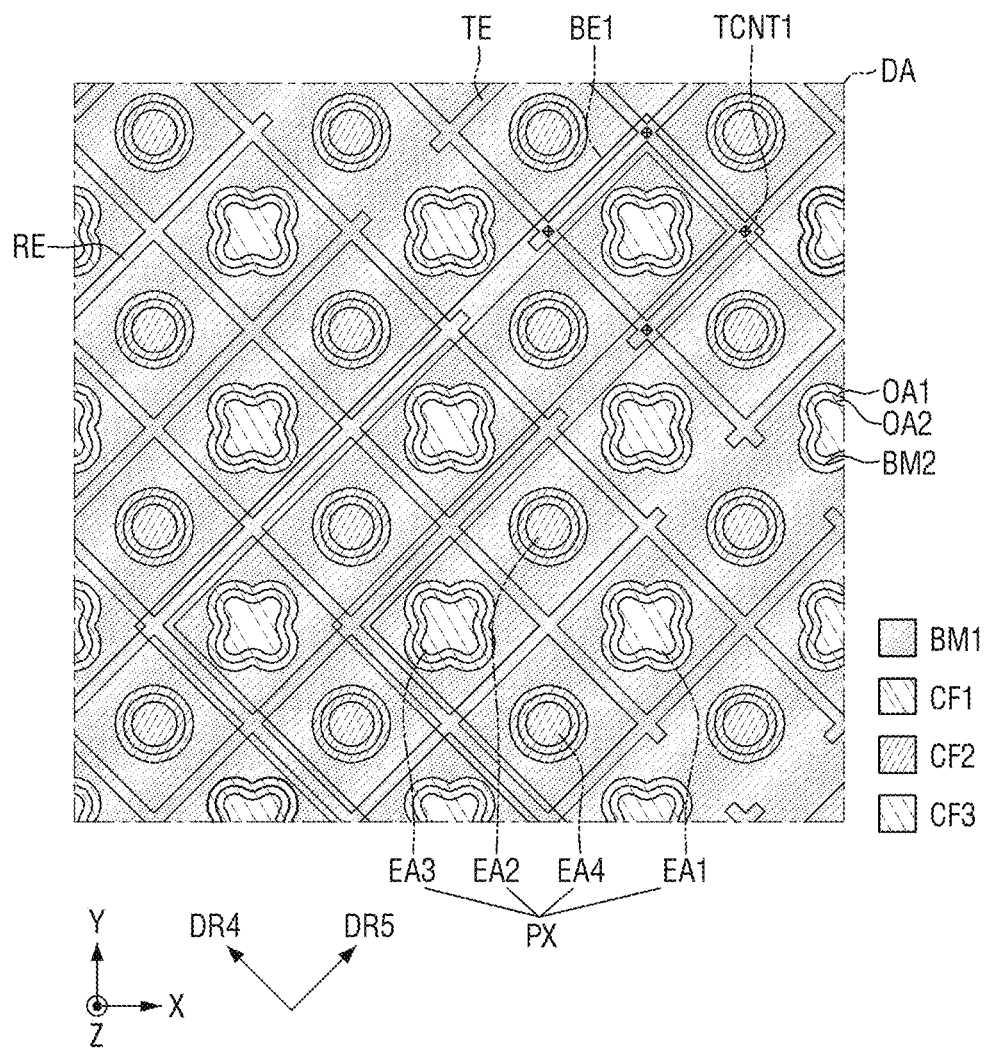
FIG. 15 is a plan view of an embodiment of a display area of a display device.

FIG. 15 is a plan view of an embodiment of a display area of a display device.

The embodiment of FIG. 15 is different from the embodiment of FIG. 5 in that each of a first emission area EA1 and a third emission area EA3 has an X shape in a plan view, and each of a second emission area EA2 and a fourth emission area EA4 has a circular shape in a plan view. In FIG. 15, differences from the embodiment of FIG. 5 will be mainly described.

Referring to FIG. 15, each of the first emission area EA1 and the third emission area EA3 may include at least one arc. In an embodiment, each of the first emission area EA1 and the third emission area EA3 may include a first arc recessed inward and a second arc protruding outward, for example. Each of the first emission area EA1 and the third emission area EA3 may include a plurality of first arcs and a plurality of second arcs.

In an alternative embodiment, each of the first emission area EA1 and the third emission area EA3 may include an arc recessed inward and a straight line. In an embodiment, each of the first emission area EA1 and the third emission area EA3 may include a straight line instead of a second arc protruding outward, for example. Each of the first emission area EA1 and the third emission area EA3 may include a plurality of arcs and a plurality of straight lines.

In FIG. 15, each of the first emission area EA1 and the third emission area EA3 has an X planar shape. However, embodiments of the specification are not limited thereto. In an embodiment, each of the first emission area EA1 and the third emission area EA3 may have a cross (+) planar shape, for example.

In addition, in FIG. 15, each of the second emission area EA2 and the fourth emission area EA4 has a circular planar shape. However, embodiments of the specification are not limited thereto. In an embodiment, each of the second emission area EA2 and the fourth emission area EA4 may have an elliptical planar shape or a polygonal planar shape such as a square, for example.

The planar shape of each of first opening areas OA1 may depend on the planar shape of an emission area overlapping the first opening area OA1. In an embodiment, the planar shape of each of the first opening areas OA1 overlapping the first emission area EA1 and the third emission area EA3 may be substantially the same as the planar shape of the first emission area EA1 and the planar shape of the third emission area EA3, for example. The planar shape of each of the first opening areas OA1 overlapping the second emission area EA2 and the fourth emission area EA4 may be substantially the same as the planar shape of the second emission area EA2 and the planar shape of the fourth emission area EA4. In an embodiment, as illustrated in FIG. 15, each of the first opening areas OA1 overlapping the first emission area EA1 and the third emission area EA3 may have an X planar shape, and each of the first opening areas OA1 overlapping the second emission area EA2 and the fourth emission area EA4 may have a circular planar shape, for example.

In addition, the planar shape of each of second opening areas OA2 may depend on the planar shape of an emission area overlapping the second opening area OA2. The planar shape of each of the second opening areas OA2 overlapping the first emission area EA1 and the third emission area EA3 may be substantially the same as the planar shape of the first emission area EA1 and the planar shape of the third emission area EA3. The planar shape of each of the second opening areas OA2 overlapping the second emission area EA2 and the fourth emission area EA4 may be substantially the same as the planar shape of the second emission area EA2 and the planar shape of the fourth emission area EA4. In an embodiment, as illustrated in FIG. 15, each of the second opening areas OA2 overlapping the first emission area EA1 and the third emission area EA3 may have an X planar shape, and each of the second opening areas OA2 overlapping the second emission area EA2 and the fourth emission area EA4 may have a circular planar shape, for example.

Figure 16:
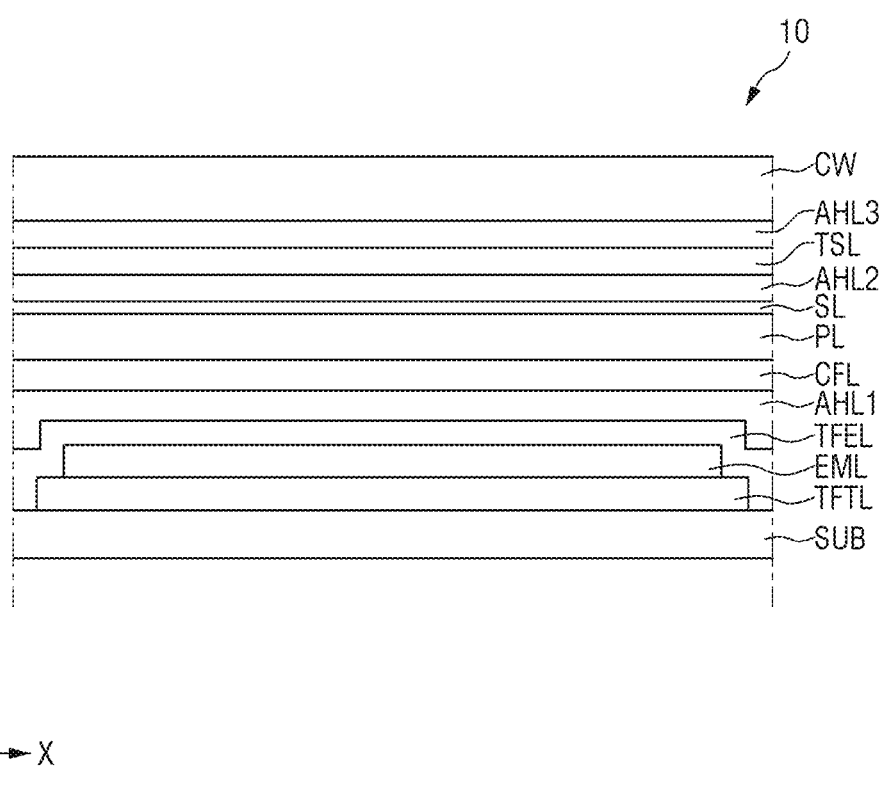
FIG. 16 is a cross-sectional view of a display device.
Figure 17:
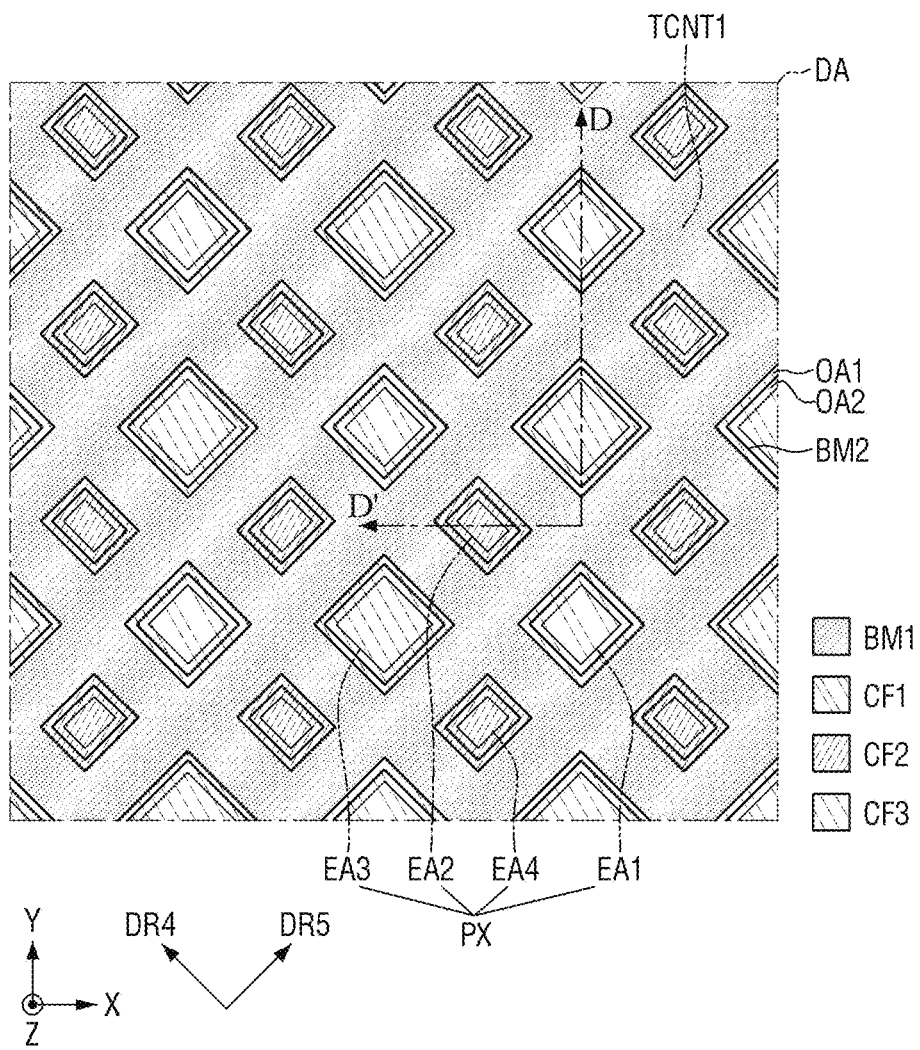
FIG. 17 is a plan view of an embodiment of a display area of the display device.
Figure 18:
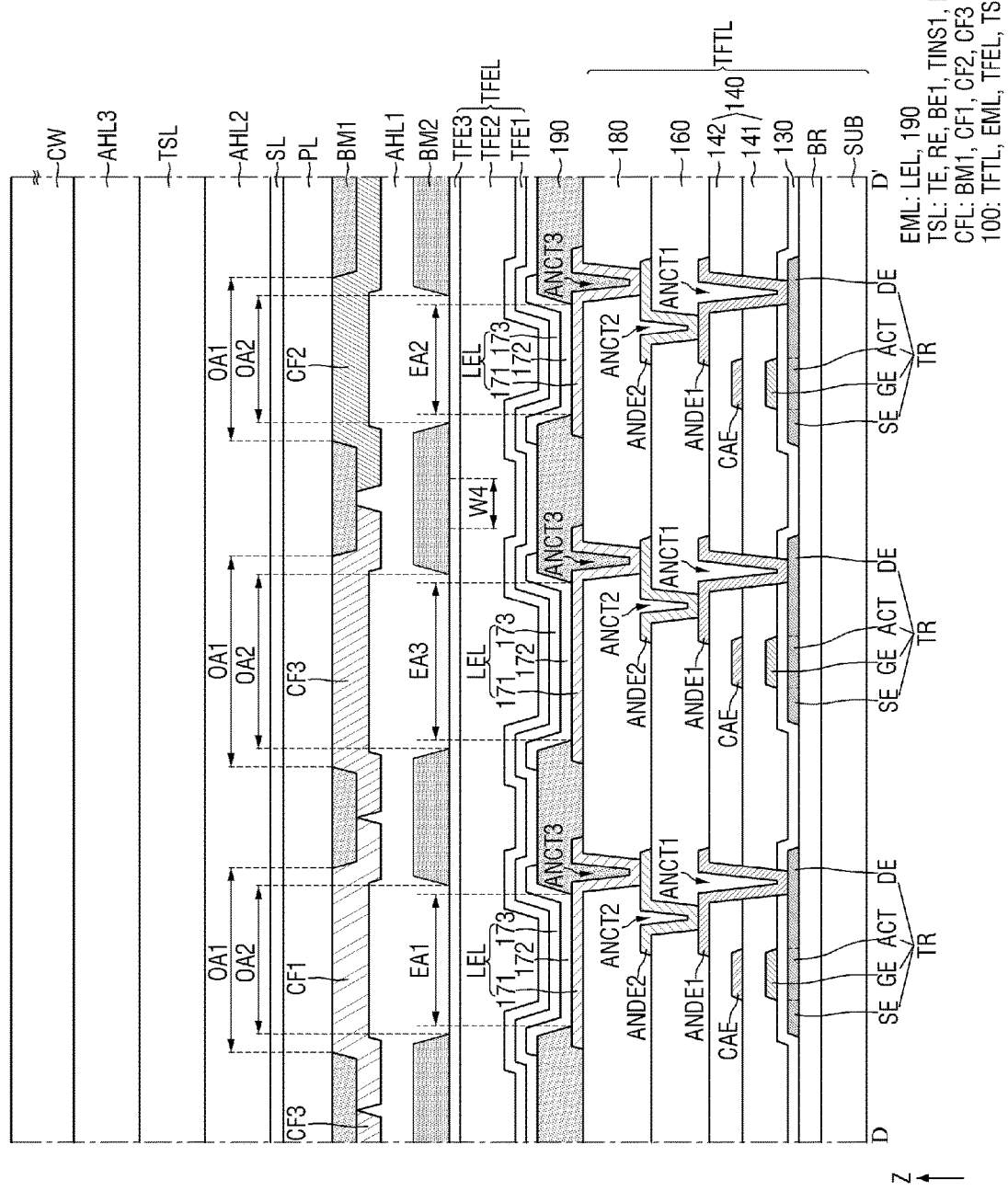
FIG. 18 is a cross-sectional view of an embodiment of the display device taken along line D-D' of FIG. 17.

FIG. 16 is a cross-sectional view of a display device. FIG. 17 is a plan view of an embodiment of a display area of the display device. FIG. 18 is a cross-sectional view of an embodiment of the display device taken along line D-D' of FIG. 17.

The embodiment of FIGS. 16 through 18 is different from the embodiment of FIGS. 2, 6 and 7 in that a touch sensing layer TSL is disposed between a support layer PL and a cover window CW. In FIG. 16 through 18, differences from the embodiment of FIGS. 2, 6 and 7 will be mainly described.

Referring to FIGS. 16 through 18, the touch sensing layer TSL may be disposed on a separation layer SL or the support layer PL. The touch sensing layer TSL may be a touch panel or a touch film formed or provided separately from a display panel 100 (refer to FIG. 2) instead of being unitary with the display panel 100. The touch sensing layer TSL may include a plurality of touch electrodes.

A second adhesive member AHL2 may be disposed between the touch sensing layer TSL and the separation layer SL or the support layer PL. The second adhesive member AHL2 bonds the touch sensing layer TSL to the separation layer SL or the support layer PL. In an embodiment, the second adhesive member AHL2 may be a transparent adhesive member such as an OCA film or an OCR.

A third adhesive member AHL3 may be disposed on the touch sensing layer TSL. The third adhesive member AHL3 bonds the touch sensing layer TSL to the cover window CW. In an embodiment, the third adhesive member AHL3 may be a transparent adhesive member such as an OCA film or an OCR.

As illustrated in FIGS. 16 through 18, when the touch sensing layer TSL is disposed on the separation layer SL or the support layer PL, a distance between a touch electrode of the touch sensing layer TSL and a common electrode 173 may be greater than when the touch sensing layer TSL is disposed on an encapsulation layer TFEL. Since parasitic capacitance between a driving electrode TE and the common electrode 173 is proportional to a distance between the driving electrode TE and the common electrode 173, when a second light blocking layer BM2 is disposed between the encapsulation layer TFEL and the touch sensing layer TSL, the parasitic capacitance between the driving electrode TE and the common electrode 173 may be smaller than when the second light blocking layer BM2 is disposed on the touch sensing layer TSL. Therefore, the touch sensitivity of the touch sensing layer TSL may increase.

In addition, each of a first adhesive member AHL1 and the second adhesive member AHL2 may include a low dielectric constant material. In an embodiment, each of the first adhesive member AHL1 and the second adhesive member AHL2 may include a longer alkyl chain, a bulky molecule, a fluorine end group, a silicone-based monomer or oligomer, or hollow particles, for example.

In an embodiment, the hollow particles may include a shell including or consisting of at least one of silica ($SiO_2$), magnesium fluoride ($MgF_2$) and iron oxide ($Fe_3O_4$) and a hollow surrounded by the shell. In an embodiment, a diameter of the hollow particles may be about 20 nm to about 200 nm. In the embodiment, a thickness of the shell of the hollow particles may be about 5 nm to about 20 nm. As the diameter of the hollow particles increases, the dielectric constant of each of the first adhesive member AHL1 and the second adhesive member AHL2 may decrease.

In addition, as the content of hollow particles increases, the dielectric constant of each of the first adhesive member AHL1 and the second adhesive member AHL2 may decrease. As a ratio of the mass of the hollow particles to the mass of each of the first adhesive member AHL1 and the second adhesive member AHL2 increases, the dielectric constant of each of the first adhesive member AHL1 and the second adhesive member AHL2 may decrease. In an embodiment, the dielectric constant of the first adhesive member AHL1 and the dielectric constant of the second adhesive member AHL2 may be 3.0 or less.

The dielectric constant of the parasitic capacitance between a touch electrode of the touch sensing layer TSL and the common electrode 173 may be proportional to the dielectric constant of the first adhesive member AHL1 and the dielectric constant of the second adhesive member AHL2. Therefore, when the dielectric constant of each of the first adhesive member AHL1 and the second adhesive member AHL2 decreases, the parasitic capacitance may decrease. Accordingly, the touch sensitivity of the touch sensing layer TSL may increase.

Figure 19:
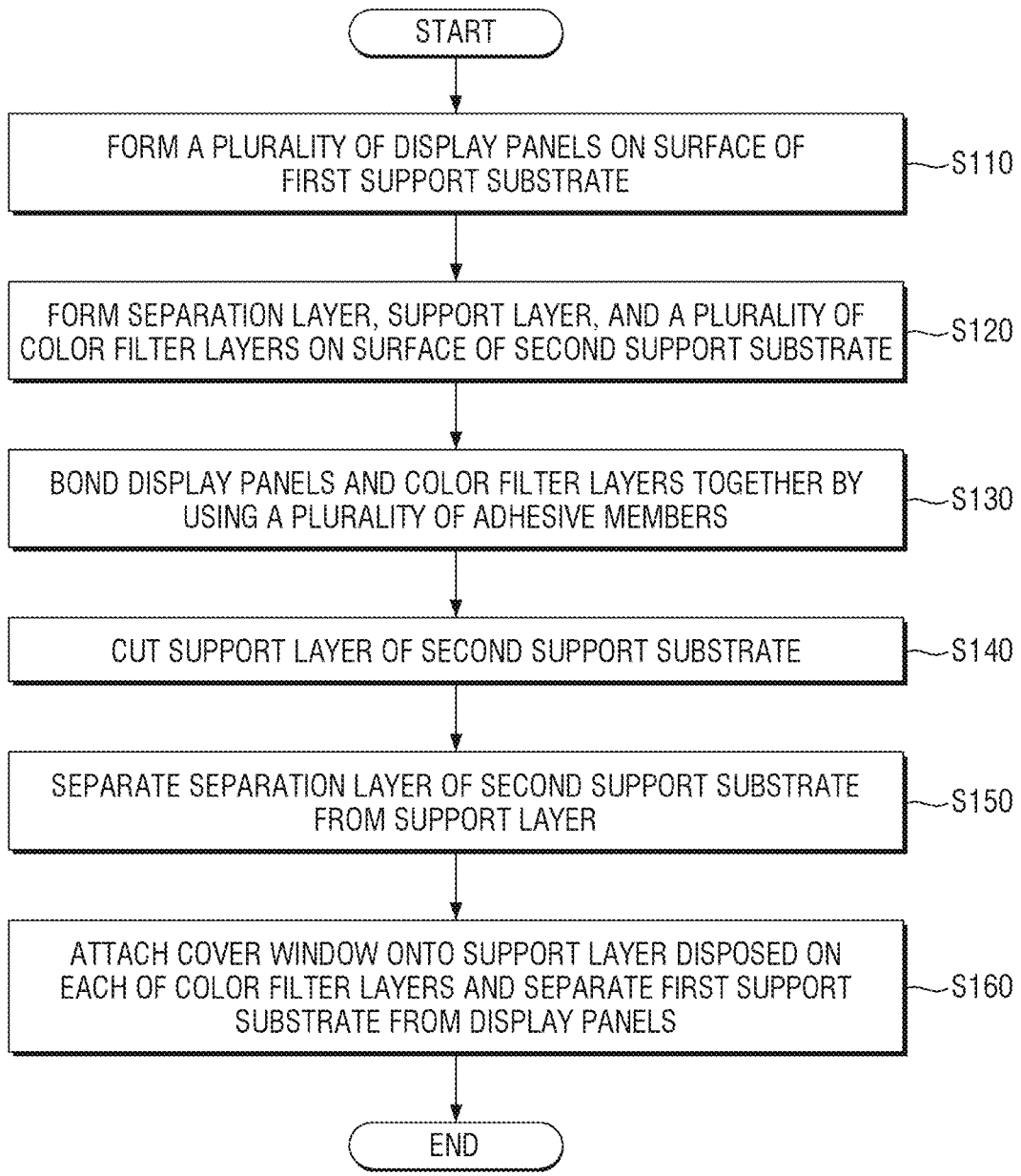
FIG. 19 is a flowchart illustrating an embodiment of a method of fabricating a display device.
Figure 20:
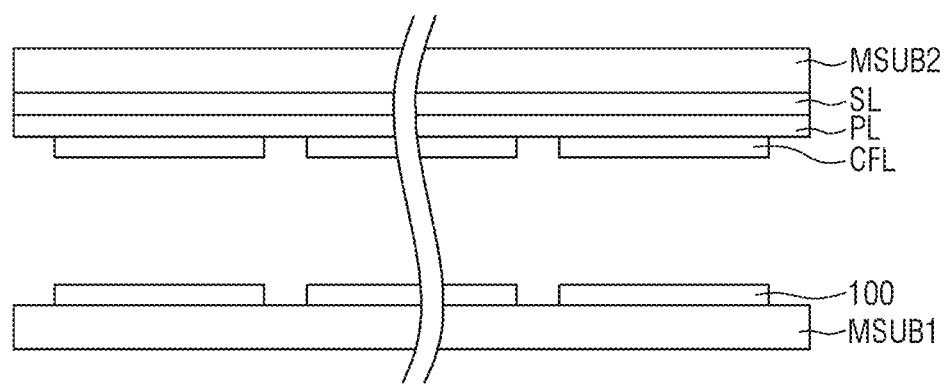
FIG. 20 is a view illustrating an embodiment of a first support substrate including a plurality of display cells and a second support substrate including a plurality of color filter cells.
Figure 21:
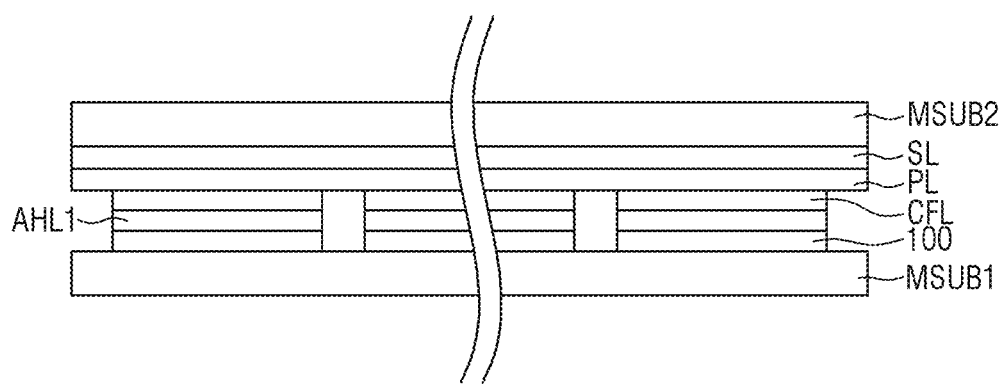
FIG. 21 is a view illustrating an embodiment of the display cells of the first support substrate and the color filter cells of the second support substrate which are bonded together by adhesive members.
Figure 22:
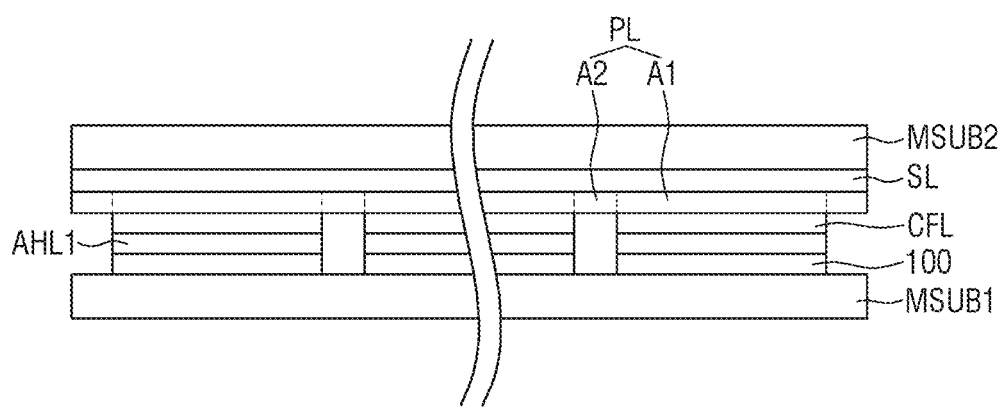
FIG. 22 is a view illustrating an embodiment of a support layer of the second support substrate cut by a laser.
Figure 23:
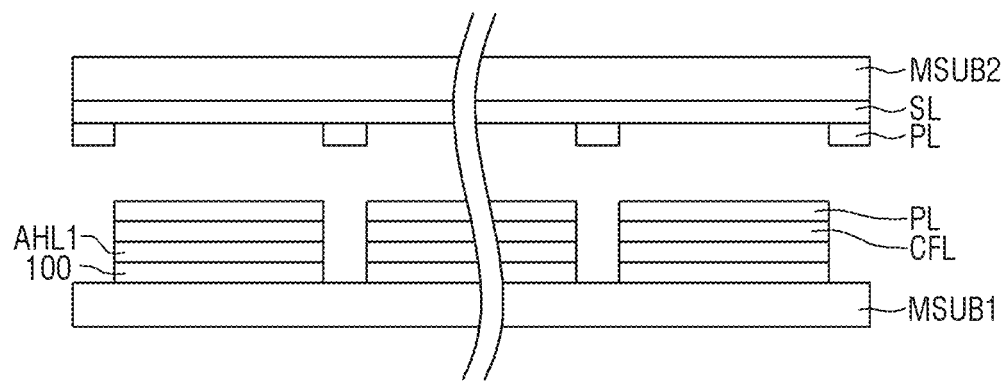
FIG. 23 is a view illustrating an embodiment of the second support substrate including a separation layer separated from the support layer.
Figure 24:
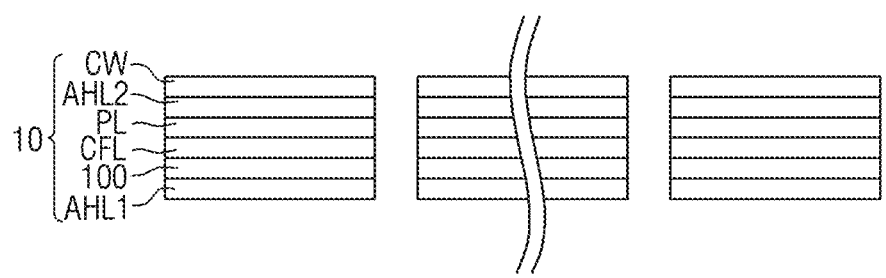
FIG. 24 is a view illustrating an embodiment of a plurality of display panels to each of which a cover window is attached.

FIG. 19 is a flowchart illustrating a method of fabricating a display device. FIG. 20 is a view illustrating an embodiment of a first support substrate including a plurality of display cells and a second support substrate including a plurality of color filter cells. FIG. 21 is a view illustrating an embodiment of the display cells of the first support substrate and the color filter cells of the second support substrate which are bonded together by adhesive members. FIG. 22 is a view illustrating an embodiment of a support layer of the second support substrate cut by a laser. FIG. 23 is a view illustrating an embodiment of the second support substrate including a separation layer separated from the support layer. FIG. 24 is a view illustrating an embodiment of a plurality of display panels to each of which a cover window is attached.

The method of fabricating a display device in the embodiment will now be described with reference to FIGS. 19 through 24.

First, referring to FIG. 20, a plurality of display panels 100 is formed or disposed on a surface of a first support substrate MSUB1 (operation S110 of FIG. 19).

Each of the display panels 100 may include a TFT layer TFTL, a light emitting element layer EML, an encapsulation layer TFEL, and a touch sensing layer TSL as illustrated in FIGS. 2, 4 and 6. In addition, each of the display panels 100 may further include a second light blocking layer BM2 as illustrated in FIG. 6.

Second, referring to FIG. 20, a separation layer SL, a support layer PL, and a plurality of color filter layers CFL are formed or disposed on a surface of a second support substrate MSUB2 (operation S120 of FIG. 19).

The support layer PL may include a first organic material, and the separation layer SL may include a second organic material. Each of the color filter layers CFL may include a first light blocking layer BM1, a first color filter CF1, a second color filter CF2, and a third color filter CF3 as illustrated in FIG. 4.

The second organic material may be a material having lower peel strength than the first organic material. In an embodiment, the peel strength of the separation layer SL may be about 1N/25 mm, for example. The adhesion between the support layer PL and the color filter layer CFL may be greater than the adhesion between the support layer PL and the separation layer SL.

In an embodiment, each of the first organic material and the second organic material may include at least one of polyimide, polyvinyl alcohol, polyamic acid, poly amide, polyethylene, polystyrene, polynorbornene, phenylmaleimide copolymer poly azobenzene, polyphenylenephthalamide, polyester, polymethyl methacrylate, polyarylate, cinnamate-based polymer, coumarin-based polymer, phthalimidine-based polymer, chalcone-based polymer, and aromatic acetylene-based polymer. In the embodiment, the second organic material may further include a fluorine compound to lower the peel strength of the separation layer SL.

Third, referring to FIG. 21, the display panels 100 and the color filter layers CFL are bonded together using a plurality of first adhesive members AHL1 (operation S130 of FIG. 19).

A surface of any one of the first adhesive members AHL1 may contact a display panel 100 corresponding to the first adhesive member AHL1 among the display panels 100, and the other surface may contact a color filter layer CFL corresponding to the first adhesive member AHL1 among the color filter layers CFL. In an embodiment, each of the first adhesive members AHL1 may be a transparent adhesive member such as an OCA film or an OCR.

Fourth, referring to FIG. 22, the support layer PL of the second support substrate MSUB2 is cut (operation S140 of FIG. 19).

The support layer PL may be cut using a laser or a wheel scriber. The support layer PL may be cut to separate first areas A1 of the support layer PL which overlap the color filter layers CFL from second areas A2 of the support layer PL which do not overlap the color filter layers CFL. That is, a cut of the support layer PL may extend from each side surface of each of the color filter layers CFL.

Fifth, referring to FIG. 23, the separation layer SL of the second support substrate MSUB2 is separated from the support layer PL (operation S150 of FIG. 19).

Since the separation layer SL includes a material having low peel strength, the adhesion between the support layer PL and the separation layer SL may be smaller than the adhesion between the support layer PL and the color filter layers CFL. Therefore, when a force is applied to separate the separation layer SL from the support layer PL, the separation layer SL may be separated from the support layer PL. Here, a part of the separation layer SL may remain on a surface of the support layer PL. In this case, a thickness of the separation layer SL may be smaller than a thickness of the support layer PL. In an alternative embodiment, the separation layer SL may not remain on the surface of the support layer PL.

Sixth, referring to FIG. 24, a cover window CW is attached onto the support layer PL disposed on each of the color filter layers CFL, and the first support substrate MSUB1 is separated from the display panels 100 (operation S160 of FIG. 19).

The cover window CW is attached onto the support layer PL disposed on each of the color filter layers CFL by a plurality of second adhesive members AHL2. Then, the first support substrate MSUB1 is separated from the display panels 100 by a laser process to complete a display device 10.

As illustrated in FIGS. 19 through 24, the display panels 100 formed or disposed on the surface of the first support substrate MSUB1 are attached to the color filter layers CFL formed or disposed on the surface of the second support substrate MSUB2 by the first adhesive members AHL1, and the separation layer SL having low peel strength is separated from the support layer PL. Therefore, the color filter layers CFL may be easily formed or disposed on the display panels 100. In this case, no new facility is desired to directly form the color filter layers CFL on the display panels 100, and a material with a lower unit cost than a material used in a low-temperature process may be used. Hence, an increase in fabrication cost may be prevented or minimized.

In a display device and a method of fabricating the same in embodiments, a plurality of display panels formed or disposed on a surface of a first support substrate is attached to a plurality of color filter layers formed or disposed on a surface of a second support substrate by a plurality of first adhesive members, and a separation layer having low peel strength is separated from a support layer. Therefore, the color filter layers may be easily formed or disposed on the display panels. In this case, no new facility is desired to directly form the color filter layers on the display panels, and a material with a lower unit cost than a material used in a low-temperature process may be used. Hence, an increase in fabrication cost may be prevented or minimized.

The invention should not be construed as being limited to the embodiments set forth herein. Rather, these embodiments are provided so that this invention will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention.

What is claimed is:

1. A display device comprising:
   a substrate;
   a plurality of pixel electrodes which are disposed on the substrate;
   a bank in which opening areas partially exposing the plurality of pixel electrodes, respectively, are defined;
   organic light emitting layers which are disposed on the plurality of pixel electrodes and correspond to the plurality of pixel electrodes, respectively;
   a common electrode which is disposed on the organic light emitting layers and the bank;
   an encapsulation layer which is disposed on the common electrode;
   a touch electrode which is disposed on the encapsulation layer and does not overlap the opening areas in a thickness direction of the substrate which is perpendicular to a main plane extension direction of the substrate;
   a first adhesive member which is disposed on the touch electrode;
   a first light blocking layer which is disposed on the first adhesive member and does not overlap the opening areas in the thickness direction of the substrate;
   a plurality of color filters which are disposed on the first adhesive member and overlap the opening areas in the thickness direction of the substrate; and
   a support layer which is disposed on the first light blocking layer and the plurality of color filters and comprises a first organic material.

2. The display device of claim 1, further comprising:
   a cover window which is disposed on the support layer; and
   a second adhesive member which is disposed between the support layer and the cover window.

3. The display device of claim 1, further comprising a separation layer which is disposed on the support layer and comprises a second organic material different from the first organic material.

4. The display device of claim 3, wherein a thickness of the separation layer is smaller than a thickness of the support layer.

5. The display device of claim 3, wherein the adhesion between the support layer and the plurality of color filters is greater than the adhesion between the support layer and the separation layer.

6. The display device of claim 1, wherein a width of the touch electrode is smaller than a width of the first light blocking layer.

7. The display device of claim 1, further comprising a second light blocking layer which is disposed between the touch electrode and the first adhesive member and does not overlap the opening areas in the thickness direction of the substrate.

8. The display device of claim 7, wherein optical density of the second light blocking layer is higher than optical density of the first light blocking layer.

9. The display device of claim 7, wherein a thickness of the second light blocking layer is greater than a thickness of the first light blocking layer.

10. The display device of claim 7, wherein a weight ratio of a black pigment of the second light blocking layer is greater than a weight ratio of a black pigment of the first light blocking layer.

11. The display device of claim 7, wherein a minimum width of the second light blocking layer is greater than a width of the touch electrode, and the minimum width of the second light blocking layer is greater than a minimum width of the first light blocking layer.

12. The display device of claim 11, wherein the minimum width of the first light blocking layer is greater than the width of the touch electrode.

13. The display device of claim 11, wherein the width of the touch electrode is greater than the minimum width of the first light blocking layer.

14. The display device of claim 7, further comprising:
   a first emission area which is disposed on a first pixel electrode among the plurality of pixel electrodes and comprises a first organic light emitting layer which emits first light among the organic light emitting layers;
   a second emission area which is disposed on a second pixel electrode among the plurality of pixel electrodes and comprises a second organic light emitting layer which emits second light among the organic light emitting layers;
   a third emission area which is disposed on a third pixel electrode among the plurality of pixel electrodes and comprises a third organic light emitting layer which emits third light among the organic light emitting layers; and
   a fourth emission area which is disposed on a fourth pixel electrode among the plurality of pixel electrodes and comprises the second organic light emitting layer.

15. The display device of claim 14, wherein a minimum width of the first light blocking layer disposed between the first emission area and the second emission area is different from a minimum width of the first light blocking layer disposed between the second emission area and the third emission area.

16. The display device of claim 14, wherein a minimum width of the first light blocking layer disposed between the third emission area and the fourth emission area is different from a minimum width of the first light blocking layer disposed between the first emission area and the fourth emission area.

17. The display device of claim 14, wherein a minimum width of the first light blocking layer disposed between the first emission area and the second emission area is equal to a minimum width of the first light blocking layer disposed between the first emission area and the fourth emission area.

18. The display device of claim 14, wherein a minimum width of the first light blocking layer disposed between the second emission area and the third emission area is equal to a minimum width of the first light blocking layer disposed between the third emission area and the fourth emission area.

19. The display device of claim 14, wherein a minimum width of the second light blocking layer disposed between the first emission area and the second emission area is different from a minimum width of the second light blocking layer disposed between the second emission area and the third emission area.

20. The display device of claim 14, wherein a minimum width of the second light blocking layer disposed between the third emission area and the fourth emission area is different from a minimum width of the second light blocking layer disposed between the first emission area and the fourth emission area.

21. The display device of claim 14, wherein a minimum width of the second light blocking layer disposed between the first emission area and the second emission area is equal to a minimum width of the second light blocking layer disposed between the first emission area and the fourth emission area.

22. The display device of claim 14, wherein a minimum width of the second light blocking layer disposed between the second emission area and the third emission area is equal to a minimum width of the second light blocking layer disposed between the third emission area and the fourth emission area.

23. The display device of claim 14, wherein a distance from the first emission area to the first light blocking layer is smaller than a distance from the first emission area to the second light blocking layer in the main plane extension direction of the substrate.

24. The display device of claim 14, wherein the plurality of color filters comprises:
a first color filter which overlaps the first emission area in the thickness direction of the substrate;
a second color filter which overlaps the second emission area in the thickness direction of the substrate; and
a third color filter which overlaps the third emission area in the thickness direction of the substrate.

25. The display device of claim 1, further comprising a second light blocking layer which is disposed between the touch electrode and the encapsulation layer and does not overlap the opening areas in the thickness direction of the substrate.

26. The display device of claim 1, further comprising an ultraviolet absorbing layer which is disposed on the touch electrode and absorbs light having a wavelength of about 200 nanometers to about 400 nanometers.

27. The display device of claim 1, further comprising a light absorbing layer which is disposed on the touch electrode and absorbs light having a predetermined wavelength range.

28. A display device comprising:
a substrate;
a plurality of pixel electrodes which are disposed on the substrate;
a bank in which opening areas partially exposing the plurality of pixel electrodes, respectively, are defined;
organic light emitting layers which are disposed on the plurality of pixel electrodes and correspond to the plurality of pixel electrodes, respectively;
a common electrode which is disposed on the organic light emitting layers and the bank;
an encapsulation layer which is disposed on the common electrode;
a first adhesive member which is disposed on the encapsulation layer;
a first light blocking layer which is disposed on the first adhesive member and does not overlap the opening areas in a thickness direction of the substrate which is perpendicular to a main plane extension direction of the substrate;
a plurality of color filters which are disposed on the first adhesive member and overlap the opening areas in the thickness direction of the substrate;
a support layer which is disposed on the first light blocking layer and the plurality of color filters and comprises a first organic material; and
a touch sensing layer which is disposed on a first surface of the support layer opposite to a second surface of the support layer facing the substrate and comprises a touch electrode.

29. The display device of claim 28, further comprising:
a second adhesive member which is disposed between the support layer and the touch sensing layer;
a cover window which is disposed on the touch sensing layer; and
a third adhesive member which is disposed between the touch sensing layer and the cover window.

30. The display device of claim 28, wherein at least any one of the first adhesive member and the second adhesive member comprises a low dielectric constant material.

31. The display device of claim 30, wherein the low dielectric constant material comprises hollow particles having a shell and a hollow surrounded by the shell.

32. The display device of claim 31, wherein the shell comprises at least one of silica ($SiO_2$), magnesium fluoride ($MgF_2$), and iron oxide ($Fe_3O_4$).

33. The display device of claim 28, wherein a dielectric constant of at least any one of the first adhesive member and the second adhesive member is 3.0 or less.

* * * * *